US009679909B2

(12) United States Patent
Chuang et al.

(10) Patent No.: US 9,679,909 B2
(45) Date of Patent: Jun. 13, 2017

(54) METHOD FOR MANUFACTURING A FINGER TRENCH CAPACITOR WITH A SPLIT-GATE FLASH MEMORY CELL

(71) Applicant: Taiwan Semiconductor Manufacturing Co., Ltd., Hsin-Chu (TW)

(72) Inventors: Harry-Hak-Lay Chuang, Zhubei (TW); Yu-Hsiung Wang, Zhubei (TW); Chen-Chin Liu, Hsinchu (TW)

(73) Assignee: Taiwan Samiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/750,071

(22) Filed: Jun. 25, 2015

(65) Prior Publication Data

US 2016/0379988 A1   Dec. 29, 2016

(51) Int. Cl.
| | | |
|---|---|---|
| H01L 27/11 | (2006.01) | |
| H01L 27/10 | (2006.01) | |
| H01L 29/66 | (2006.01) | |
| H01L 29/94 | (2006.01) | |
| H01L 27/11575 | (2017.01) | |
| H01L 27/1157 | (2017.01) | |

(52) U.S. Cl.
CPC .... *H01L 27/11575* (2013.01); *H01L 27/1157* (2013.01)

(58) Field of Classification Search
CPC .......... H01L 27/11575; H01L 27/1157; H01L 27/10852; H01L 28/55; H01L 28/40; H01L 28/91; H01L 28/60; H01L 29/66181; H01L 27/10829; H01L 27/10835; H01L 29/945

USPC .......................................................... 438/239
See application file for complete search history.

(56) References Cited

U.S. PATENT DOCUMENTS

| | | | |
|---|---|---|---|
| 2001/0026973 A1 | 10/2001 | Yeh et al. | |
| 2002/0197788 A1 | 12/2002 | Kuwazawa | |
| 2003/0038313 A1 | 2/2003 | Furuhata | |
| 2003/0080366 A1* | 5/2003 | Tamura | H01L 27/11526 257/298 |
| 2004/0207004 A1* | 10/2004 | Tamura | H01L 27/11526 257/315 |
| 2004/0232461 A1* | 11/2004 | Huang | H01L 27/10861 257/296 |

(Continued)

*Primary Examiner* — John C Ingham
*Assistant Examiner* — Didarul Mazumder
(74) *Attorney, Agent, or Firm* — Eschweiler & Potashnik, LLC

(57) ABSTRACT

A method for forming a split-gate flash memory cell, and the resulting integrated circuit, are provided. A semiconductor substrate having memory cell and capacitor regions are provided. The capacitor region includes one or more sacrificial shallow trench isolation (STI) regions. A first etch is performed into the one or more sacrificial STI regions to remove the one or more sacrificial STI regions and to expose one or more trenches corresponding to the one or more sacrificial STI regions. Dopants are implanted into regions of the semiconductor substrate lining the one or more trenches. A conductive layer is formed filling the one or more trenches. A second etch is performed into the conductive layer to form one of a control gate and a select gate of a memory cell over the memory cell region, and to form an upper electrode of a finger trench capacitor over the capacitor region.

20 Claims, 21 Drawing Sheets

(56) References Cited

U.S. PATENT DOCUMENTS

| | | | |
|---|---|---|---|
| 2006/0022242 A1* | 2/2006 | Sugatani | H01L 21/76229 257/296 |
| 2006/0244042 A1 | 11/2006 | Jeon et al. | |
| 2008/0318406 A1 | 12/2008 | Jeon et al. | |
| 2009/0239351 A1* | 9/2009 | Aloni | H01L 28/60 438/396 |
| 2009/0242953 A1* | 10/2009 | Booth, Jr. | H01L 27/0629 257/301 |
| 2012/0261725 A1* | 10/2012 | Flachowsky | H01L 21/26506 257/288 |
| 2016/0020292 A1* | 1/2016 | Kwon | G11C 16/0466 257/324 |

* cited by examiner

METHOD FOR MANUFACTURING A FINGER TRENCH CAPACITOR WITH A SPLIT-GATE FLASH MEMORY CELL

BACKGROUND

A trend in the semiconductor manufacturing industry is to integrate different semiconductor components of a composite semiconductor device into a common semiconductor structure. Such integration advantageously allows lower manufacturing costs, simplified manufacturing procedures, and increased operational speed. One type of composite semiconductor device is an embedded flash memory device. An embedded flash memory device includes an array of flash memory cells and logic devices supporting operation of the flash memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
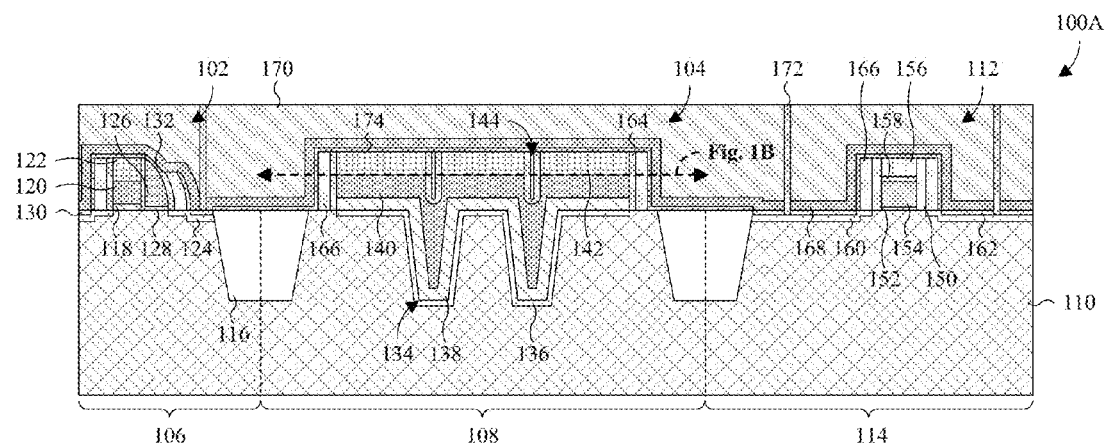
FIG. 1A illustrates a cross-sectional view of some embodiments of an integrated circuit with a split-gate flash memory cell, a finger trench capacitor, and a polysilicon-based logic device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Embedded flash memory devices include flash memory cells and logic devices supporting operation of the flash memory cells. Flash memory cells include, for example, stacked-gate flash memory cells and split-gate flash memory devices (e.g., metal-oxide-nitride-oxide-semiconductor (MONOS) memory cells). Compared to stacked-gate flash memory cells, split-gate flash memory cells have lower power consumption, higher injection efficiency, less susceptibility to short channel effects, and over erase immunity. As such, split-gate flash memory cells are more prevalent. Logic devices include, for example, address decoders and read/write circuitry.

Split-gate flash memory cells and/or logic devices often operate using a wide range of different voltages. For example, for a split-gate flash memory cell, an erase voltage is often comparatively high to a read voltage. Accordingly, embedded flash memory devices may include charge pumps to generate different voltages. Charge pumps use capacitors as energy storage devices to generate different voltages. Further, split-gate flash memory cells and/or logic devices are often used in mixed-signal system-on-a-chip (SOC) applications. In such applications, capacitors are often used to filter noise, to generate time varying signals, or for other mixed-signal applications. Accordingly, embedded flash memory devices may include capacitors for purposes beyond charge pumps. Capacitors used within embedded flash memory devices include polysilicon-insulator-polysilicon (PIP) capacitors, metal-insulator-metal (MIM) capacitors, and metal-oxide-metal (MOM) capacitors. However, manufacturing embedded flash memory devices with the foregoing capacitors leads to increased costs and complex integration processes. For example, the foregoing capacitors use additional masks and processing steps during the manufacture of embedded flash devices.

In view of the foregoing, the present application is directed to a method for manufacturing a split-gate flash memory cell with a finger trench capacitor. Further, the present application is directed to an integrated circuit resulting from performance of the method. The finger trench capacitor is formed from a polysilicon or otherwise conductive layer of a split-gate flash memory cell. The conductive layer may correspond to a select gate of the split-gate flash memory cell, or to a control gate of the split-gate flash memory cell. Advantageously, by forming the split-gate flash memory cell with the finger trench capacitor, costs are reduced and the integration complexity is reduced. For example, fewer masks and processing steps are used.

With reference to FIG. 1A, a cross-sectional view 100A of some embodiments of an integrated circuit having a split-gate flash memory cell 102 and a finger trench capacitor 104 is provided. The integrated circuit may be, for example, an embedded flash memory device. The split-gate flash memory cell 102 and the finger trench capacitor 104 are respectively arranged over and/or within a memory cell region 106 and a capacitor region 108 of a semiconductor substrate 110. Further, in some embodiments a logic device 112 is arranged over a logic region 114 of the semiconductor substrate 110. In such embodiments, the capacitor region 108 is typically arranged between the memory cell region 106 and the logic region 114. One or more isolation regions 116, such as shallow trench isolation (STI) regions, are arranged in the semiconductor substrate 110 between the memory cell region 106, the capacitor region 108, and in some embodiments, the logic region 114 to isolate the regions 106, 108, 114 from each other. The semiconductor substrate 110 may be, for example, a bulk silicon substrate or a silicon-on-insulator (SOI) substrate.

The split-gate flash memory cell 102 may be, for example, a MONOS memory cell or a silicon-oxide-nitride-oxide-silicon (SONOS) memory cell. The split-gate flash memory cell 102 includes a memory cell stack with a select gate dielectric layer 118, a select gate 120, and a select gate hard mask 122 stacked in that order over the memory cell region 106. The select gate hard mask 122 is arranged over the select gate 120, and the select gate dielectric layer 118 is arranged under the select gate 120 between the select gate 120 and the semiconductor substrate 110. The select gate hard mask 122 may be, for example, a nitride, such as silicon nitride. The select gate 120 may be, for example, a conductive material, such as doped polysilicon or metal. The select gate dielectric layer 118 may be, for example, an oxide, such as silicon oxide.

A pair of memory source/drain regions 124 of the split-gate flash memory cell 102 are implanted within the semiconductor substrate 110 and arranged on opposing sides of the memory cell stack. In some embodiments, doping concentrations and/or thicknesses of the memory source/drain regions 124 discretely taper towards the memory cell stack to give stepped profiles. Further, a control gate 126, and a control gate, charge trapping dielectric layer 128, of the split-gate flash memory cell 102 are arranged between the memory cell stack and one of the memory source/drain regions 124 of the pair. The control gate dielectric layer 128 extends from under the control gate 126 to between neighboring sidewalls of the control gate 126 and memory cell stack. The control gate dielectric layer 128 may be, for example, a multilayer oxide-nitride-oxide (ONO) stack or a multilayer oxide-silicon nanocrystal-oxide (OSiO) stack. The multilayer ONO stack may include a first (e.g., lower) oxide layer, a conformal nitride layer arranged over and abutting the first oxide layer, and a second (e.g., upper) oxide layer arranged over and abutting the nitride layer. The multilayer OSiO stack may include a first (e.g., lower) oxide layer, a layer of silicon dots arranged over and abutting the first oxide layer, and a second (e.g., upper) oxide layer arranged over and abutting the layer of Si dots. The control gate 126 may be, for example, a conductive material, such as doped polysilicon or metal. In some embodiments, memory silicide layers 130, 132 of the split-gate flash memory 102 are arranged in and/or on top surfaces of the memory source/drain regions 124 and/or the control gate 126.

The finger trench capacitor 104 includes one or more first trenches 134 in the capacitor region 108 of the semiconductor substrate 110. A doped region 136 of the semiconductor substrate 110 extends along an upper surface of the capacitor region 108 and along the first trench(es) 134. The doped region 136 defines a lower electrode of the finger trench capacitor 104. A capacitor stack of the finger trench capacitor 104 is arranged over the doped region 136 and fills the first trench(es) 134. The capacitor stack includes a first capacitor dielectric layer 138, an upper electrode 140, and a capacitor hard mask 142 stacked in that order. The capacitor hard mask 142 is arranged over the upper electrode 140, and the first capacitor dielectric layer 138 is arranged under the upper electrode 140 between the upper electrode 140 and the lower electrode. The first capacitor dielectric layer 138 may be, for example, an oxide, such as silicon dioxide. The capacitor hard mask 142 may be, for example, a nitride, such as silicon nitride, and is typically part of the same layer as the select gate hard mask 122. The upper electrode 140 may be, for example, a conductive material, such as doped polysilicon or metal, and is typically part of the same layer as the select gate 120. As to the latter, the upper electrode 140 and/or the select gate 120 may share the same composition, crystalline structure, and/or electrical characteristics.

In some embodiments, the finger trench capacitor 104 further includes one or more second trenches 144 corresponding to the first trench(es) 134. The second trench(es) 144 extend through the capacitor hard mask 142 into the upper electrode 140, and are aligned with the corresponding first trench(es) 134.

The logic device 112 may be, for example, an n- or p-type metal-oxide-semiconductor field-effect transistor (MOSFET). The logic device 112 includes a logic device stack, and a first spacer layer 150 lining sidewalls of the logic device stack. The logic device stack includes a logic gate dielectric layer 152, a logic gate 154, a logic hard mask 156, and a logic hard mask dielectric layer 158. The logic hard mask 156 is arranged over the logic gate 154 with the logic hard mask dielectric layer 158 arranged therebetween, and the logic gate dielectric layer 152 is arranged under the logic gate 154 between the semiconductor substrate 110 and the logic gate 154. The logic hard mask 156 may be, for example, a nitride. The logic hard mask dielectric layer 158 and the logic gate dielectric layer 152 may be, for example, an oxide and/or a high κ (i.e., a dielectric with a dielectric constant exceeding about 3.9). The logic gate 154 may be, for example, doped polysilicon or metal. Where the logic gate 154 is metal, the logic gate dielectric layer 152 is typically a high κ dielectric. The first spacer layer 150 may be or otherwise include, for example an oxide and/or a nitride.

In some embodiments, the select gate 120, the control gate 126, the upper electrode 140, and the logic gate 154 are respectfully made of first, second, third, and fourth polysilicon layers. One or more of the first, second, third, and fourth polysilicon layers may share the same composition and/or electrical characteristics. For example, the select gate 120 and the upper electrode 140 may correspond to polysilicon layers sharing the same composition and/or electrical characteristics.

A pair of logic source/drain regions 160 of the logic device 112 are implanted within the semiconductor substrate 110 and arranged on opposing sides of the logic device stack. In some embodiments, doping concentrations and/or thicknesses of the logic source/drain regions 160 discretely taper towards the first spacer layer 150 to give stepped profiles. Further, in some embodiments, logic silicide layers 162 of the logic device 112 are arranged in top surfaces of the logic source/drain regions 160.

A second spacer layer 164 is arranged along sidewalls of the split-gate flash memory cell 102 and the finger trench capacitor 104, and a third spacer layer 166 is arranged along sidewalls of the split-gate flash memory cell 102, the finger trench capacitor 104, and the logic device 112. In some embodiments, where the finger trench capacitor 104 includes the second trench(es) 144, the second and third spacer layers 164, 166 further fill the second trench(es) 144. The second and third spacer layers 164, 166 may be, for example, a multilayer ONO stack, a multilayer OSiO stack, an oxide, or a nitride.

An etch stop layer 168 is arranged over the isolation region(s) 116, the split-gate flash memory cell 102, the finger trench capacitor 104, the logic device 112, and the semiconductor substrate 110. Further, an interlayer dielectric (ILD) layer 170 is arranged over the etch stop layer 168, and contacts 172 extend through the ILD layer 170 and the etch stop layer 168 to the memory and logic silicide layers 130, 132, 162. In some embodiments, a resist protect oxide (RPO) layer 174 is arranged under the etch stop layer 168 around the memory and logic silicide layers 130, 132, 162. The etch stop layer 168 may be, for example, an oxide or a nitride. The ILD layer 170 may be, for example, an oxide or a low κ dielectric (i.e., a dielectric with a dielectric constant less than about 3.9). The contacts 172 may be, for example, a metal, such as tungsten, aluminum, or copper.

Figure 1B:
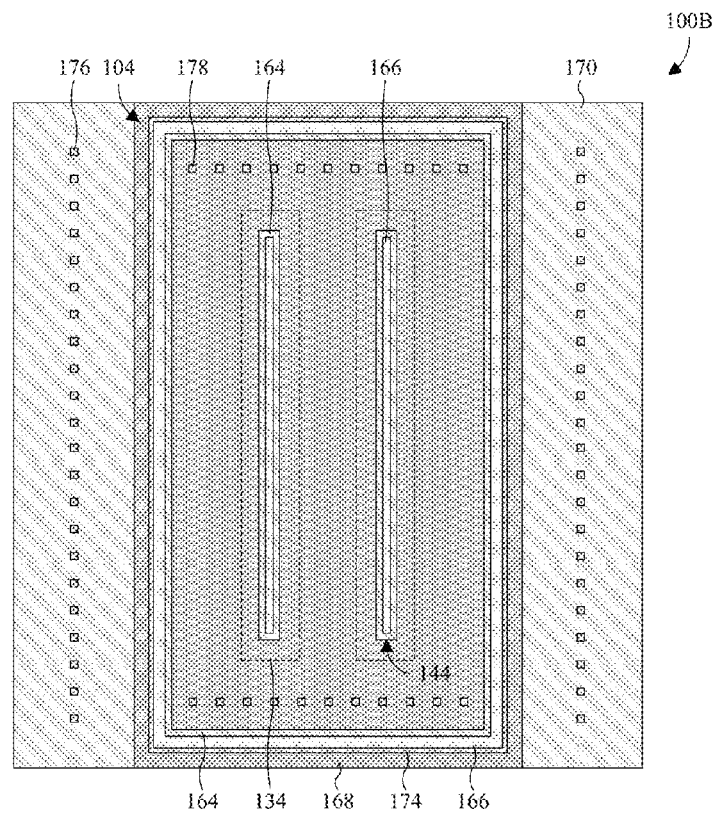
FIG. 1B illustrates a longitudinal view of some embodiments of the integrated circuit of FIG. 1A.

With reference to FIG. 1B, a longitudinal view 100B of some embodiments of the integrated circuit of FIG. 1A is provided. The longitudinal view 100B is taken along the top surface of the upper electrode 140, and illustrates the arrangement of the finger trench capacitor 104. First contacts 176 are laterally spaced from the finger trench capacitor 104, and arranged on opposing sides of the finger trench capacitor 104. Further, the etch stop layer 168, the RPO layer 174, and the second and third spacer layers 164, 166 surround the finger trench capacitor 104. Second contacts 178 are arranged over the finger trench capacitor 104 on opposing sides of the finger trench capacitor 104. Further, the second trench(es) 144 are arranged over and aligned with the first trench(es) 134, and the second and third spacer layers 164, 166 fill the second trench(es) 144.

Figure 1C:
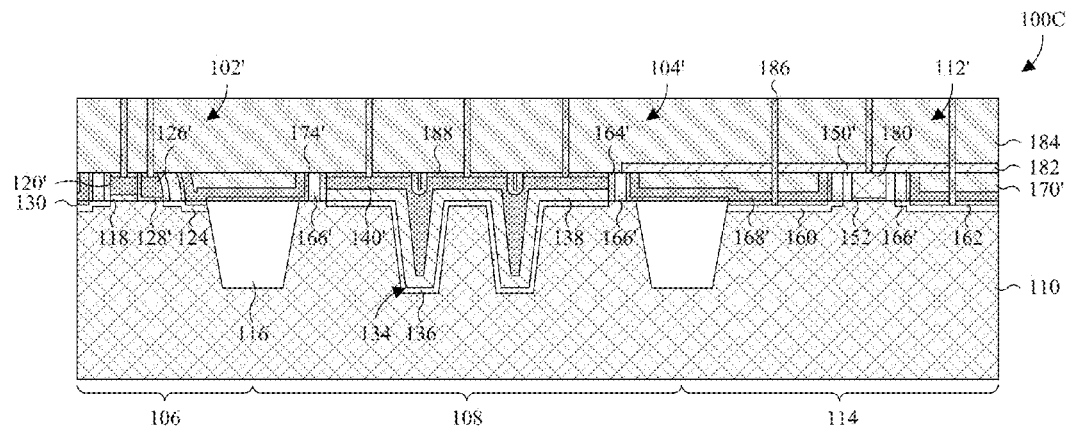
FIG. 1C illustrates a cross-sectional view of some embodiments of an integrated circuit with a split-gate flash memory cell, a finger trench capacitor, and a metal-based logic device.

With reference to FIG. 1C, a cross-sectional view 100C of other embodiments of the integrated circuit of FIG. 1A is provided. Whereas the embodiments of FIG. 1A generally pertain to a polysilicon-based logic device, the embodiments of FIG. 1C generally pertain to a metal-based logic device. In these embodiments, there are no hard masks overlying a select gate 120' of a split-gate flash memory cell 102', an upper electrode 140' of a finger trench capacitor 104', and a logic gate 180 of a logic device 112'. The logic gate 180 is typically metal, and a logic gate dielectric layer 152 is typically a high κ dielectric. Further, one or more of the select gate 120', the upper electrode 140', the logic gate 180, a control gate 126', a charge trapping dielectric layer 128', first, second, and third spacer layers 150', 164', 166', an RPO layer 174', an etch stop layer 168', and an ILD layer 170' have approximately coplanar upper surfaces.

A dielectric capping layer 182 masks the logic region 114, and a second ILD layer 184 is arranged over the planar surface and the dielectric capping layer 182. Contacts 186 extend through the second ILD layer 184 to the logic gate 180, the upper electrode 140', the select gate 120', the control gate 126', and source/drain regions 124, 160. Further, additional silicide layers 188 are arranged over and/or within one or more of the select gate 120', the control gate 126', and the upper electrode 140'. The dielectric capping layer 182 may be, for example, an oxide. The second ILD layer 184 may be, for example, an oxide or a low κ dielectric. The contacts 186 may be, for example, a metal, such as tungsten, aluminum, or copper.

Figure 2A:
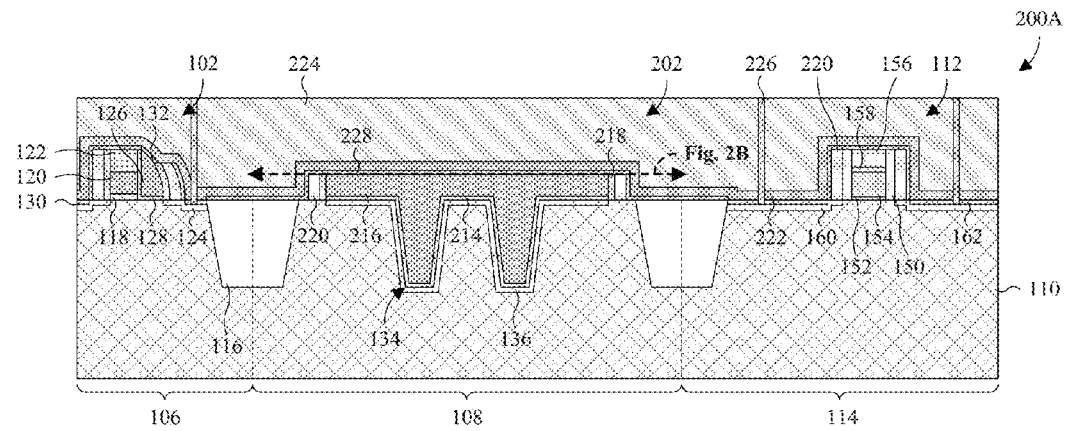
FIG. 2A illustrates a cross-sectional view of other embodiments of an integrated circuit with a split-gate flash memory cell, a finger trench capacitor, and a polysilicon-based logic device.

With reference to FIG. 2A, a cross-sectional view 200A of other embodiments of an integrated circuit having a split-gate flash memory cell 102 and a finger trench capacitor 202 is provided. The finger trench capacitor 202 includes a capacitor stack arranged over a doped region 136 of a semiconductor substrate 110, and filling one or more trenches 134 in the semiconductor substrate 110. The doped region 136 of the semiconductor substrate 110 extends along an upper surface of a capacitor region 108 of the semiconductor substrate 110 and along the trench(es) 134. Further, the doped region 136 defines a lower electrode of the finger trench capacitor 202.

The capacitor stack includes a capacitor, charge trapping dielectric layer 214 and an upper electrode 216 stacked in that order. The capacitor dielectric layer 214 is arranged under the upper electrode 216 between the upper electrode 216 and the doped region 136. The capacitor dielectric layer 214 may be, for example, a multilayer ONO stack or a multilayer OSiO stack. Further, the capacitor dielectric layer 214 may be part of a common, albeit discontinuous, charge trapping dielectric layer that includes a control gate dielectric layer 128 of the split-gate flash memory cell 102. The upper electrode 216 may be, for example, a conductive material, such as doped polysilicon or metal, and is typically part of the same layer as a control gate 126. As to the latter, the upper electrode 216 and/or a control gate 126 of the split-gate flash memory cell 102 may share the same composition, crystalline structure, and/or electrical characteristics.

In some embodiments, a select gate 120 of the split-gate flash memory cell 102, the control gate 126, the upper electrode 216, and a logic gate 154 of a logic device 112 are respectfully made of first, second, third, and fourth polysilicon layers. One or more of the first, second, third, and fourth polysilicon layers may share the same composition and/or electrical characteristics. For example, the control gate 126 and the upper electrode 216 may correspond to polysilicon layers sharing the same composition and/or electrical characteristics.

A second spacer layer 218 is arranged along sidewalls of the split-gate flash memory cell 102 and the finger trench capacitor 202, and a third spacer layer 220 is arranged along sidewalls of the split-gate flash memory cell 102, the finger trench capacitor 202, and the logic device 112. The second and third spacer layers 218, 220 may be, for example, a multilayer ONO stack, a multilayer OSiO stack, an oxide, or a nitride.

An etch stop layer 222 is arranged over one or more isolation regions 116, the split-gate flash memory cell 102, the finger trench capacitor 202, the logic device 112, and the semiconductor substrate 110. Further, an ILD layer 224 is arranged over the etch stop layer 222, and contacts 226 extend through the ILD layer 224 and the etch stop layer 222 to memory and logic silicide layers 130, 132, 162. In some embodiments, a RPO layer 228 is arranged under the etch stop layer 222, around the memory and logic silicide layers 130, 132, 162. The etch stop layer 222 may be, for example, an oxide or a nitride. The ILD layer 224 may be, for example, an oxide or a low κ dielectric. The contacts 226 may be, for example, a metal, such as tungsten or copper.

Figure 2B:
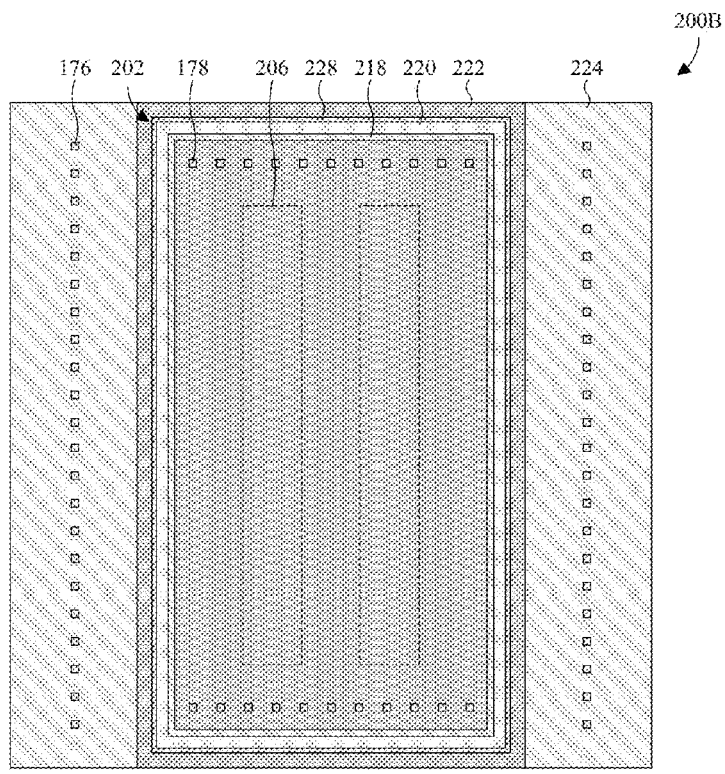
FIG. 2B illustrates a longitudinal view of some embodiments of the integrated circuit of FIG. 2A.

With reference to FIG. 2B, a longitudinal view 200B of some embodiments of the integrated circuit of FIG. 2A is provided. The longitudinal view 200B is taken along the top surface of the upper electrode 216, and illustrates the arrangement of the finger trench capacitor 202. First contacts 176 are laterally spaced from the finger trench capacitor 202, and arranged on opposing sides of the finger trench capacitor 202. Further, the etch stop layer 222, the RPO layer 228, and the second and third spacer layers 218, 220 surround the finger trench capacitor 202. Second contacts 178 are arranged over the finger trench capacitor 202 on opposing, distal sides of the first trench(es) 134.

Figure 2C:
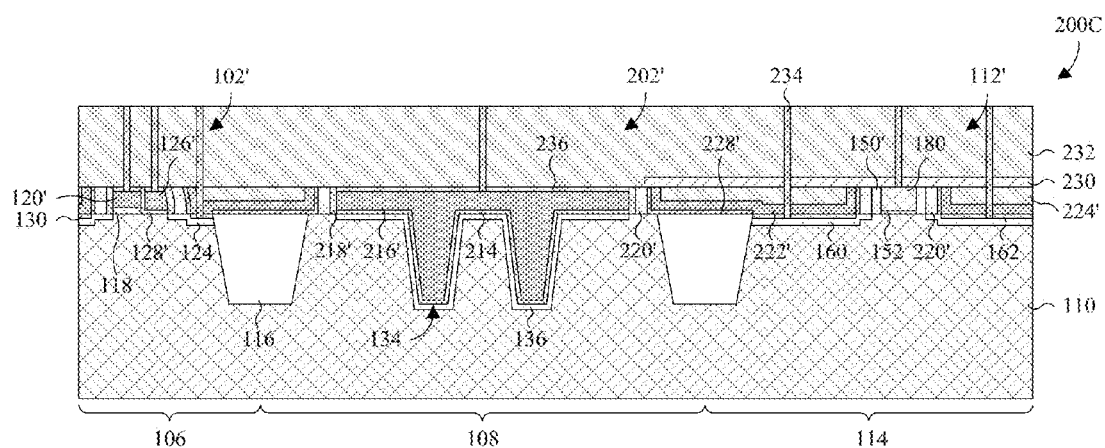
FIG. 2C illustrates a cross-sectional view of some embodiments of the integrated circuit of FIG. 2A.

With reference to FIG. 2C, a cross-sectional view 200C of other embodiments of the integrated circuit of FIG. 2A is provided. Whereas the embodiments of FIG. 2A generally pertain to a polysilicon-based logic device, the embodiments of FIG. 2C generally pertain to a metal-based logic device. In these embodiments, there are no hard masks overlying a select gate 120' of a split-gate flash memory cell 102', an upper electrode 216' of a finger trench capacitor 202', and a logic gate 180 of a logic device 112'. The logic gate 180 is typically metal, and a logic gate dielectric layer 152 is typically a high κ dielectric. Further, one or more of the select gate 120', a control gate 126', the upper electrode 216', the logic gate 180, a control gate, charge trapping dielectric layer 128', an RPO layer 228', an etch stop layer 222', first, second, and third spacer layers 150', 218', 220', and an ILD layer 224' have approximately coplanar upper surfaces.

A dielectric capping layer 230 masks the logic region 114, and a second ILD layer 232 is arranged over the planar surface and the dielectric capping layer 230. Contacts 234 extend through the second ILD layer 232 to the logic gate 180, the upper electrode 216', the select gate 120', the control gate 126', and source/drain regions 124, 160. Further, additional silicide layers 236 are arranged over and/or within one or more of the select gate 120', the control gate 126', and the upper electrode 216'. The dielectric capping layer 230 may be, for example, an oxide. The second ILD layer 232 may be, for example, an oxide or a low κ dielectric. The contacts 234 may be, for example, a metal, such as tungsten, aluminum, or copper.

Figure 3:
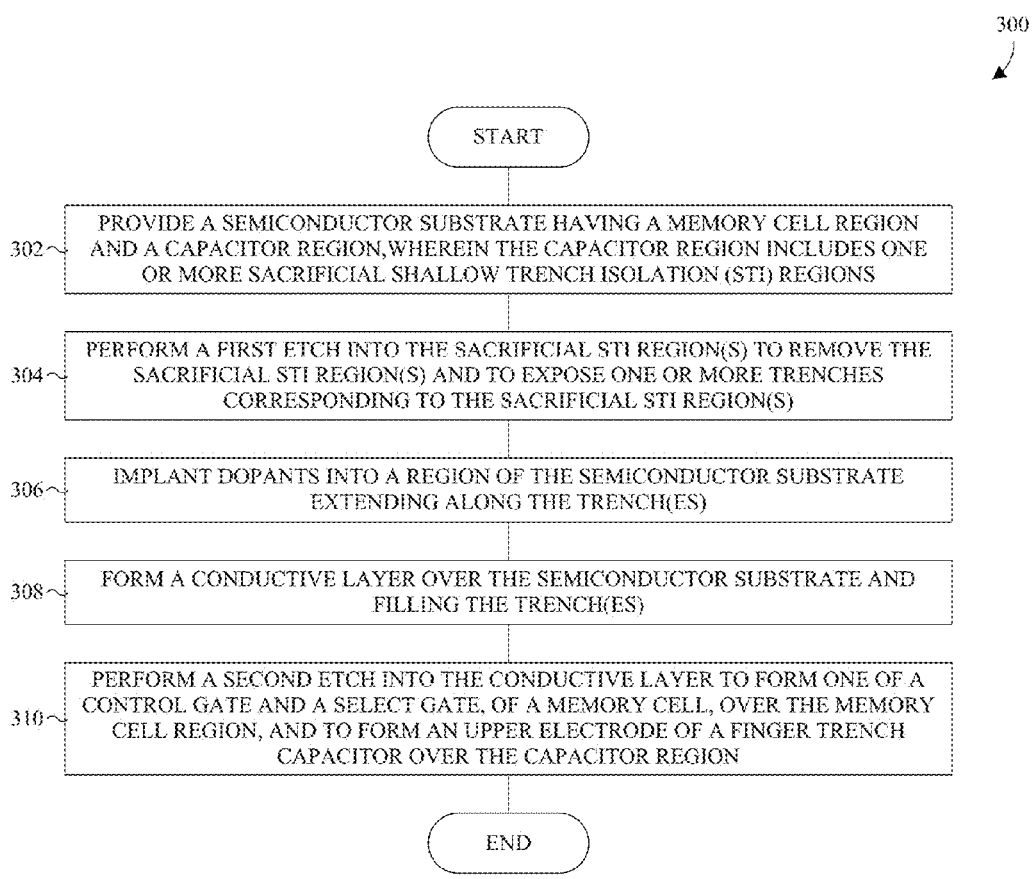
FIG. 3 illustrates a flowchart of some embodiments of a method for manufacturing an integrated circuit with a split-gate flash memory cell, a finger trench capacitor, and a metal-based logic device.

With reference to FIG. 3, a flowchart of some embodiments of a method for manufacturing an integrated circuit, with a split-gate flash memory cell and a finger trench capacitor, is provided.

At 302, a semiconductor substrate having a memory cell region and a capacitor region is provided. The capacitor region includes one or more sacrificial STI regions.

At 304, a first etch is performed into the sacrificial STI regions to remove the sacrificial STI region(s) and to expose one or more trenches corresponding to the sacrificial STI region(s).

At 306, dopants are implanted into a region of the semiconductor substrate extending along the trench(es).

At 308, a conductive layer is formed over the semiconductor substrate and filling the trench(es).

At 310, a second etch is performed into the conductive layer to form one of a control gate and a select gate, of a memory cell, over the memory cell region, and to form a top electrode of a finger trench capacitor over the capacitor region.

Advantageously, forming integrated circuits (e.g., embedded flash memory devices) according to the foregoing method reduces costs and the complexity of integrating capacitors with split-gate flash memory cells. A finger trench capacitor is formed with a split-gate flash memory cell, and shares a conductive layer with the split-gate flash memory cell. This conductive layer may, for example, correspond to the select gate or the control gate. Forming the finger trench capacitor with the split gate flash memory cell reduces the number of masks and the number of processing steps.

While the method described by the flowchart 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 4:
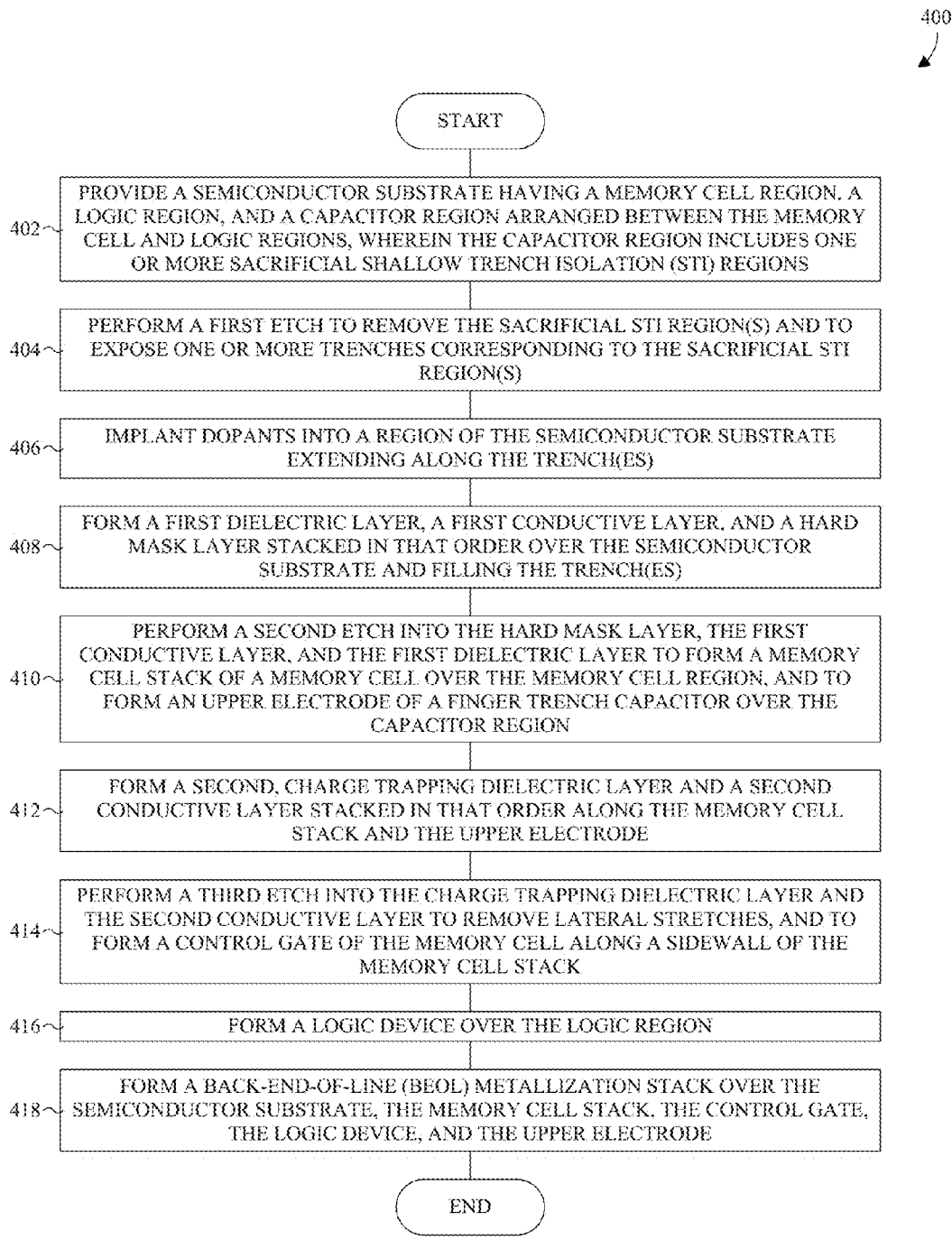
FIG. 4 illustrates a flowchart of some more detailed embodiments of the method of FIG. 3.

With reference to FIG. 4, a flowchart of some more detailed embodiments of the method of FIG. 3 is provided. As will be seen, these embodiments form an upper electrode of a finger trench capacitor and a select gate of a split-gate flash memory cell.

At 402, a semiconductor substrate having a memory cell region, a logic region, and a capacitor region arranged between the memory cell and logic regions is provided. The capacitor region includes one or more sacrificial STI regions.

At 404, a first etch is performed to remove the sacrificial STI region(s) and to expose one or more trenches corresponding to the sacrificial STI region(s).

At 406, dopants are implanted into a region of the semiconductor substrate extending along the trench(es).

At 408, a first dielectric layer, a first conductive layer, and a hard mask layer are formed stacked in that order over the semiconductor substrate and filling the trenches.

At 410, a second etch is performed into the hard mask layer, the first conductive layer, and the first dielectric layer to form a memory cell stack over the memory cell region, and to form an upper electrode of a finger trench capacitor over the capacitor region.

At 412, a second, charge trapping dielectric layer and a second conductive layer are formed stacked in that order along the memory cell stack and the upper electrode.

At 414, a third etch is performed into the charge trapping dielectric layer and the second conductive layer to remove lateral stretches, and to form a control gate of the memory cell along a sidewall of the memory cell stack.

At 416, a logic device is formed over the logic region.

At 418, a back end of line (BEOL) metallization stack is formed over the semiconductor substrate, the memory cell stack, the control gate, the logic device, and the upper electrode.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 5-19, cross-sectional views of some embodiments of a semiconductor structure at various stages of manufacture are provided to illustrate the method of FIG. 4. Although FIGS. 5-19 are described in relation to the method, it will be appreciated that the structures disclosed in FIGS. 5-19 are not limited to the method, but instead may stand alone as structures independent of the method. Similarly, although the method is described in relation to FIGS. 5-19, it will be appreciated that the method is not limited to the structures disclosed in FIGS. 5-19, but instead may stand alone independent of the structures disclosed in FIGS. 5-19.

Figure 5:
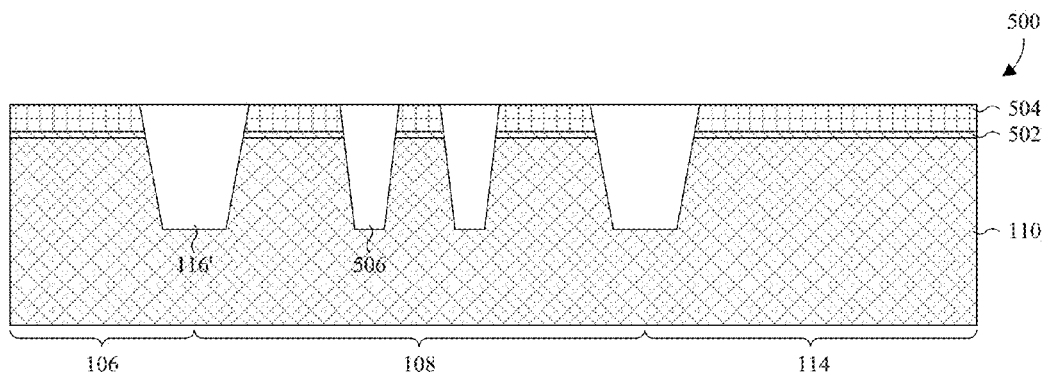
FIGS. 5-19 illustrate a series of cross-sectional views of some embodiments of an integrated circuit at various stages of manufacture, the integrated circuit including a split-gate flash memory cell and a finger trench capacitor.

FIG. 5 illustrates a cross-sectional view 500 of some embodiments corresponding to Act 402. As illustrated, a semiconductor substrate 110 is provided. The semiconductor substrate 110 includes a memory cell region 106, a logic region 114, and a capacitor region 108 arranged between the memory cell region 106 and the logic region 114. Further, the semiconductor substrate 110 is covered by a first dielectric layer 502 and a first hard mask layer 504 stacked in that order. The first dielectric layer 502 may be, for example, an oxide, such as silicon dioxide. The first hard mask layer 504 may be, for example, a nitride, such as silicon nitride. The semiconductor substrate 110 may be, for example, a bulk silicon substrate or an SOI substrate.

First STI regions 116' extend through the first dielectric layer 502 and the hard mask layer 504 into the semiconductor substrate 110 to isolate the memory cell region 106, the capacitor region 108, and the logic region 114 from each other. One or more second, sacrificial STI regions 506 extend through the first dielectric layer 502 and the first hard mask layer 504 into the capacitor region 108. In some embodiments, the first and second STI regions 116', 506 extend to depth of about 2500 Angstroms. Further, in some embodiments, the second STI regions 506 have a ratio of height to width exceeding about three.

Figure 6:
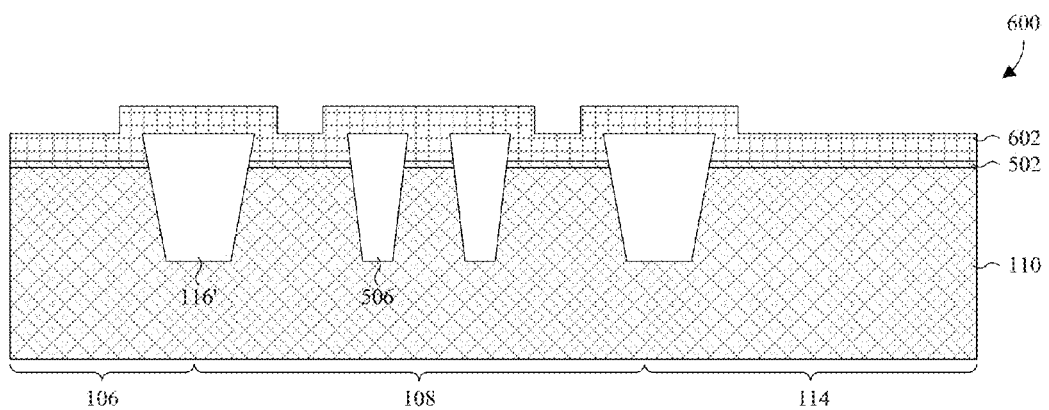
Figure 7:
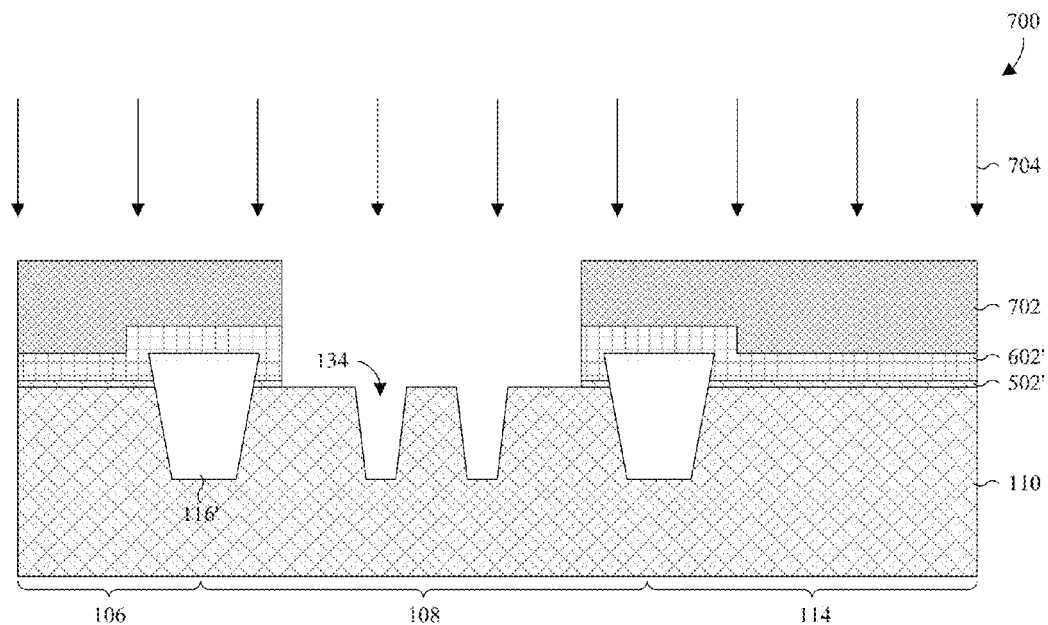

FIGS. 6 and 7 illustrate cross-sectional views 600, 700 of some embodiments corresponding to Act 404.

As illustrated by FIG. 6, a first etch is performed into the first hard mask layer 504 to remove the first hard mask layer 504. The process for performing the first etch may include, for example, applying an etchant selective of the first hard mask layer 504 relative to the first dielectric layer 502. Further, a second hard mask layer 602 is formed lining the first dielectric layer 502 and exposed regions of the first and second STI regions 116', 506. The second hard mask layer 602 may be, for example, a nitride, such as silicon nitride.

As illustrated by FIG. 7, one or more second etches are performed through regions of the second hard mask layer 602 and the first dielectric layer 502 overlying the capacitor region 108 to remove these regions. Further, the second etch(es) remove the sacrificial STI region(s) 506. By removing the sacrificial STI region(s) 506, one or more trenches 134 corresponding to the sacrificial STI region(s) 506 are exposed. The process for performing the one or more second etches may include, for example, forming a photoresist layer 702 masking regions of the second hard mask layer 602 surrounding the capacitor region 108. One or more etchants 704 may then be sequentially applied to the second hard mask layer 602, the first dielectric layer 502, and the sacrificial STI region(s) 506. With the one or more etchant(s) 704 applied, the photoresist layer 702 may be removed.

Figure 8:
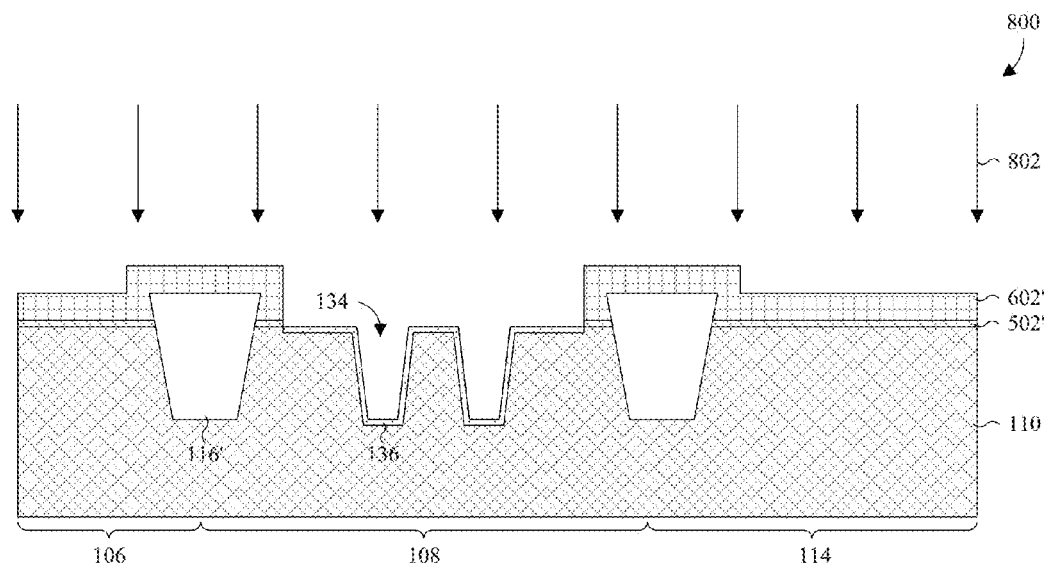

FIG. 8 illustrates a cross-sectional view 800 of some embodiments corresponding to Act 406. As illustrated, dopants 802 are implanted into an exposed region of the semiconductor substrate 110 lining the trench(es) 134. The doped region 136 of the semiconductor substrate 110 defines a lower electrode of a finger trench capacitor being formed.

Figure 9:
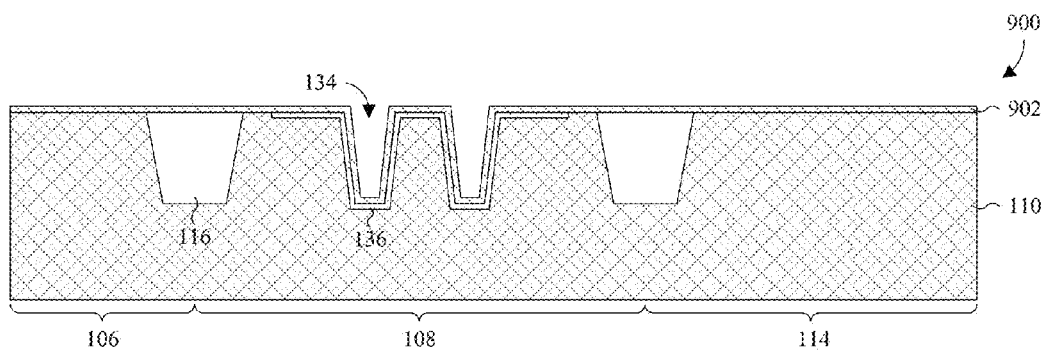
Figure 10:
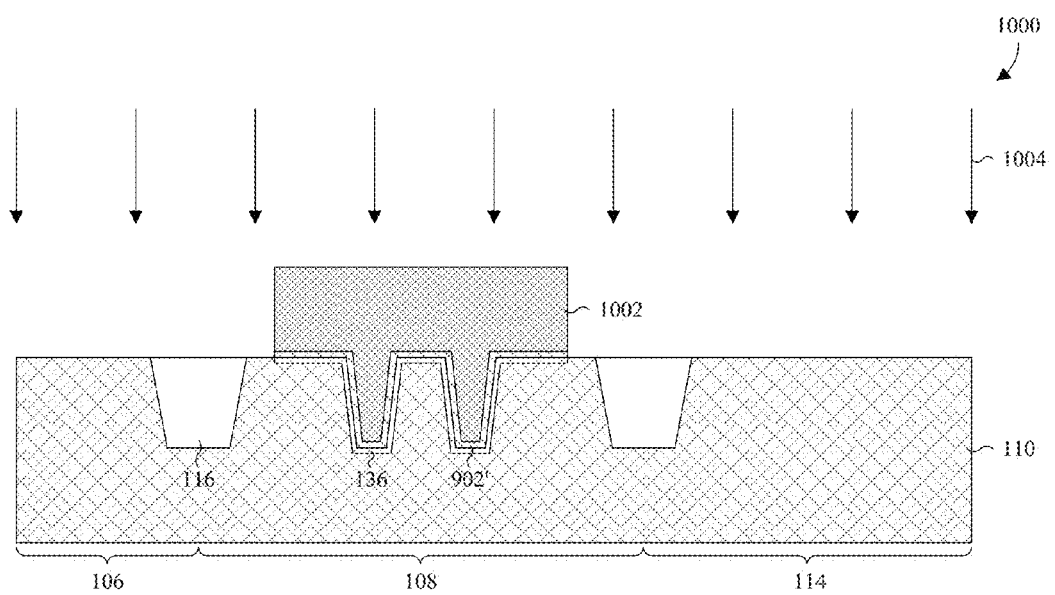
Figure 11:
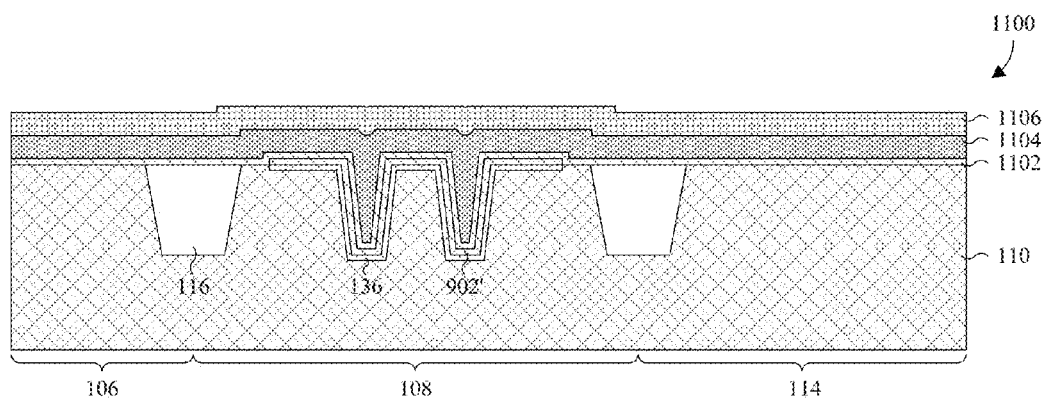

FIGS. 9-11 illustrate cross-sectional views 900, 1000, 1100 of some embodiments corresponding to Act 408.

As illustrated by FIG. 9, one or more third etches are performed into the remaining second hard mask layer 602' and the remaining first dielectric layer 502' to remove the remaining second hard mask layer 602' and the remaining first dielectric layer 502'. The process for performing the third etch(es) may include, for example, growing a thin oxide over the doped regions 136 of the semiconductor substrate 110. One or more etchants may then be sequentially applied to the remaining second hard mask layer 602' and the remaining first dielectric layer 502' to remove the remaining second hard mask layer 602' and the remaining first dielectric layer 502'. In some embodiments, the third etch(es) etch back the first STI regions 116' to about even with a top surface of the semiconductor substrate 110.

Also illustrated by FIG. 9, a second dielectric layer 902 is formed over the semiconductor substrate 110 and lining the trench(es) 134. The second dielectric layer 902 may be, for example, an oxide, such as silicon dioxide.

As illustrated by FIG. 10, a fourth etch performed into the second dielectric layer 902 to remove regions of the second dielectric layer 902 surrounding the capacitor region 108. The process for performing the fourth etch may include, for example, forming a photoresist layer 1002 masking the capacitor region 108. An etchant 1004 may then be applied to the second dielectric layer 902, followed by removal of the photoresist layer 1002.

As illustrated by FIG. 11, a third dielectric layer 1102, a first conductive layer 1104, and a third hard mask layer 1106 are formed stacked in that order over the semiconductor substrate 110 and the remaining second dielectric layer 902'. The third dielectric layer 1102 is formed lining the remaining second dielectric layer 902' and the trench(es) 134. The first conductive layer 1104 is formed lining the third dielectric layer 1102 and filling the trench(es) 134. The third hard mask layer 1106 is formed lining first conductive layer 1104. The third dielectric layer 1102 may be, for example, an oxide, such as silicon dioxide. The first conductive layer 1104 may be, for example, a conductive material, such as doped polysilicon or metal. The third hard mask 1106 layer may be, for example, a nitride, such as silicon nitride.

Figure 12:
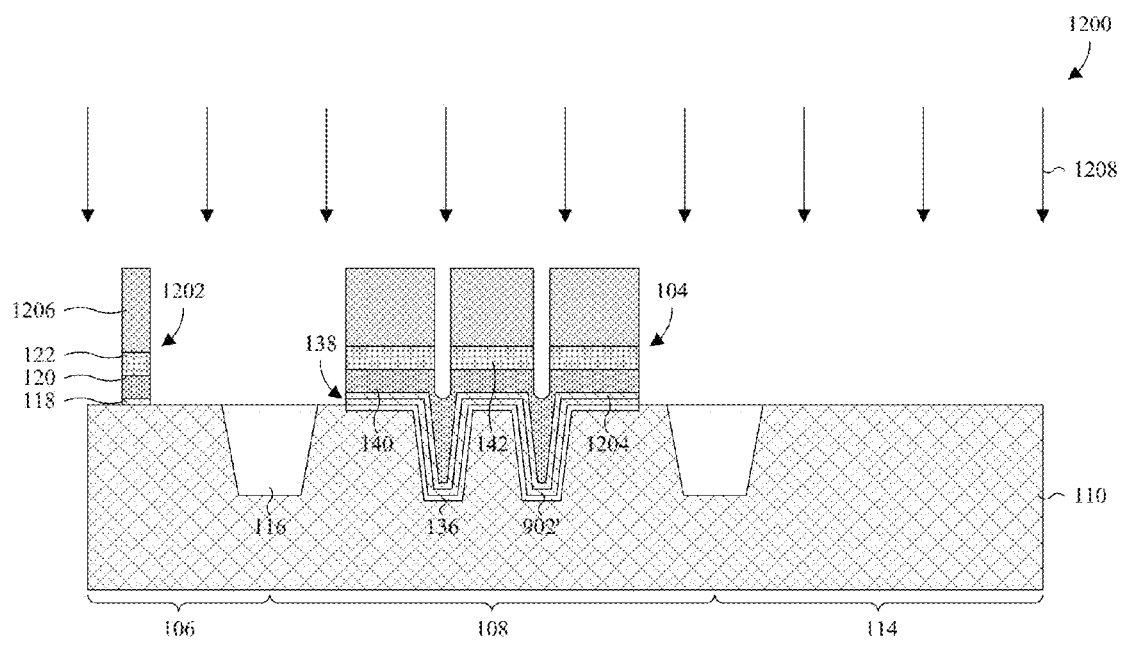

FIG. 12 illustrates a cross-sectional view 1200 of some embodiments corresponding to Act 410. As illustrated, one or more fifth etches are performed to the semiconductor substrate 110 through select regions of the third hard mask layer 1106, the first conductive layer 1104, and the third dielectric layer 1102. The fifth etch(es) result in a memory cell stack 1202 over the memory cell region 106, and a finger trench capacitor 104 over the capacitor region 108. The memory cell stack 1202 includes a select gate hard mask 122 overlying a select gate 120, and a select gate dielectric layer 118 underlying the select gate 120 between the select gate 120 and the semiconductor substrate 110. The finger trench capacitor 104 includes a capacitor hard mask 142 overlying an upper electrode 140, and a capacitor dielectric layer 138 intermediate the upper electrode 140 and the semiconductor substrate 110.

A region of the first conductive layer 1104 overlying the memory cell region 106 defines the select gate 120, and a region of the first conductive layer 1104 overlying the capacitor region 108 defines the upper electrode 140. A region of the third hard mask layer 1106 overlying the memory cell region 106 defines the select gate hard mask 122, and a region of the third hard mask layer 1106 overlying the capacitor region 108 defines the capacitor hard mask 142. A region of the third dielectric layer 1102 overlying the memory cell region 106 defines the select gate dielectric layer 118. Further, a region 1204 of the third dielectric layer 1102 overlying the capacitor region 108, together with the remaining second dielectric layer 902', defines the capacitor dielectric layer 138.

The process for performing the fifth etch(es) may include, for example, forming a photoresist layer 1206 masking regions of the third hard mask layer 1106 corresponding to the memory cell stack 1202 and the finger trench capacitor 104. One or more etchants 1208 may then be sequentially applied to the third hard mask layer 1106, the first conductive layer 1104, and the third dielectric layer 1102. Following application of the etchant(s) 1208, the photoresist layer 1206 may be removed.

Figure 13:
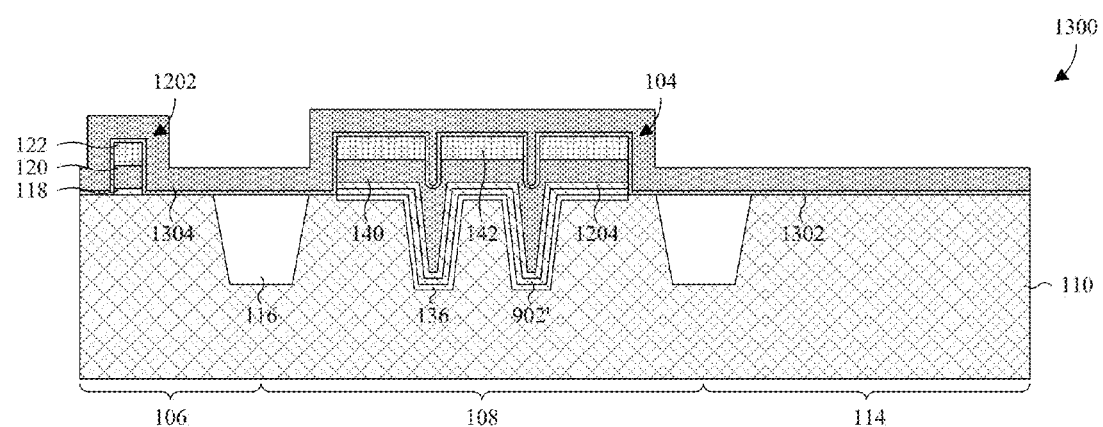

FIG. 13 illustrates a cross-sectional view 1300 of some embodiments corresponding to Act 412. As illustrated, a fourth, charge trapping dielectric layer 1302 and a second conductive layer 1304 are formed stacked in that order over the semiconductor substrate 110. The charge trapping dielectric layer 1302 and the second conductive layer 1304 are formed lining the memory cell stack 1202 and the finger trench capacitor 104. The charge trapping dielectric layer 1302 may be formed as, for example, a multilayer ONO stack or a multilayer OSiO stack. The second conductive layer 1304 may be formed as, for example, doped polysilicon or a metal.

Figure 14:
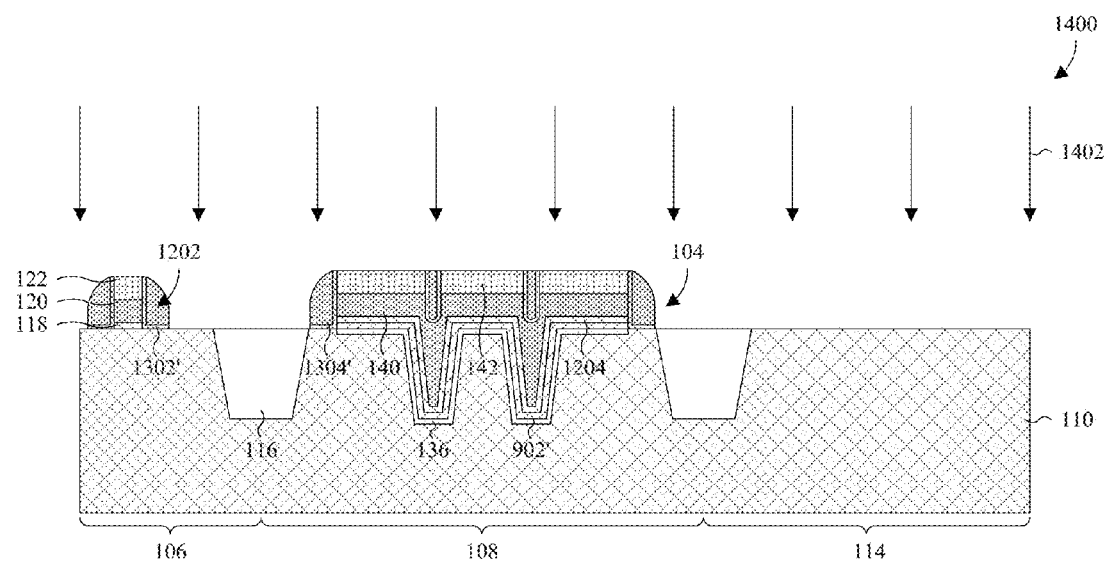
Figure 15:
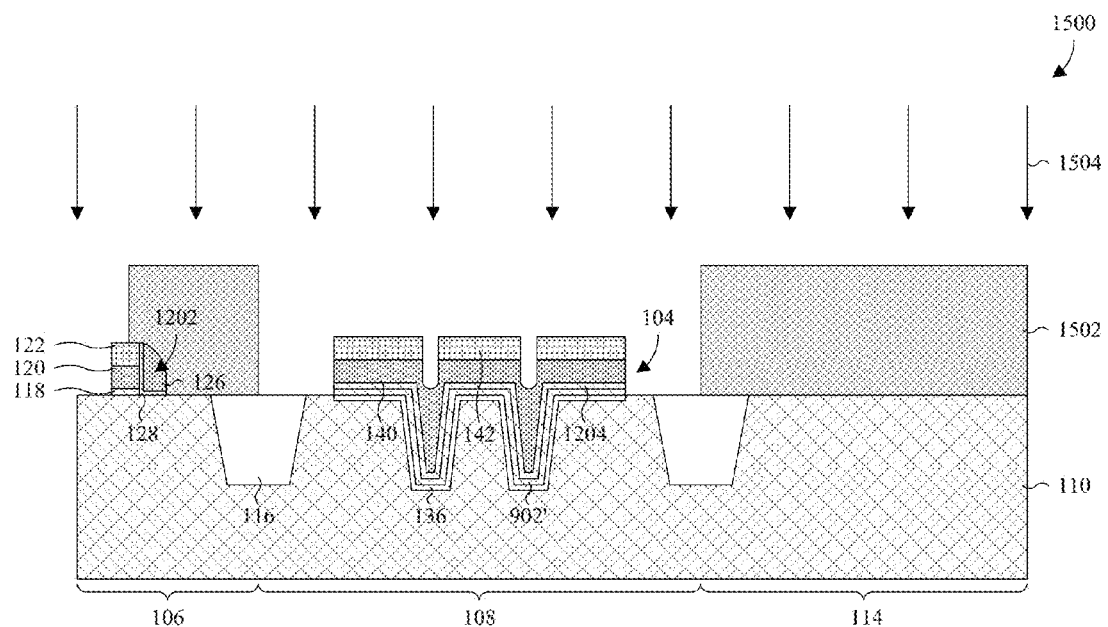

FIGS. 14 and 15 illustrate cross-sectional views 1400, 1500 of some embodiments corresponding to Act 414.

As illustrated by FIG. 14, one or more sixth etches are performed into the second conductive layer 1304 and the charge trapping dielectric layer 1302 to remove lateral stretches. The process for performing the sixth etch(es) may include, for example, applying an etchant selective of the second conductive layer 1304 to etch back the second conductive layer 1304 and remove lateral stretches. Thereafter, one or more additional etchants 1402 selective of the charge trapping dielectric layer 1302 may be applied to etch back the charge trapping dielectric layer 1302 and remove lateral stretches unmasked by the remaining second conductive layer 1304'.

As illustrated by FIG. 15, one or more seventh etches are performed into the remaining second conductive layer 1304' and the remaining charge trapping dielectric layer 1302'. The seventh etch(es) remove all regions of the remaining second conductive layer 1304' and the remaining charge trapping dielectric layer 1302' neighboring the memory cell stack 1202 and the finger trench capacitor 104, except regions abutting a single side of the memory cell stack 1202 neighboring the finger trench capacitor 104. The seventh etch(es) form a control gate 126 along a single sidewall of the memory cell stack 1202. The process for performing the seventh etch(es) may include, for example, forming a photoresist layer 1502 masking regions of the remaining second conductive layer 1304' corresponding to the control gate 126 and/or the logic region 114. One or more etchants 1504 may then be applied to the remaining second conductive layer 1304' and the remaining charge trapping dielectric layer 1302' according to the pattern of the photoresist layer 1502. Further, the photoresist layer 1502 may be removed.

Figure 16:
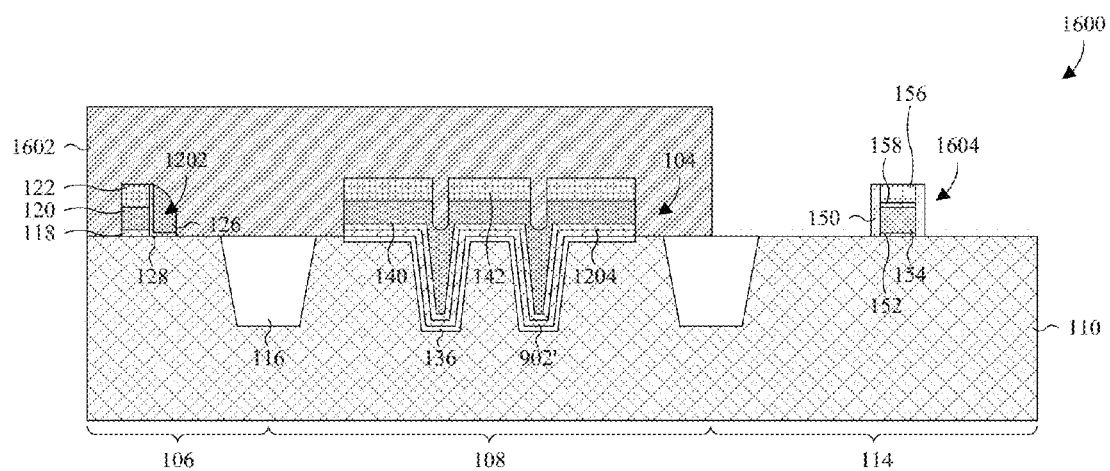
Figure 17:
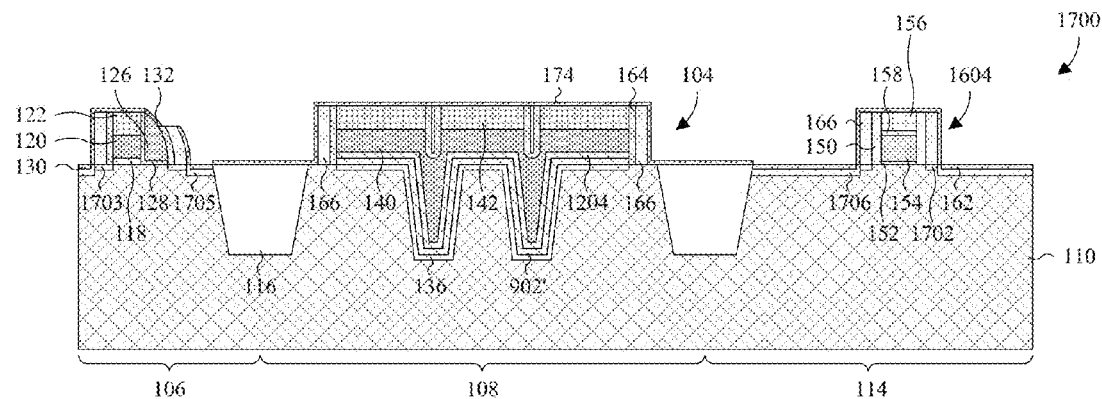

FIGS. 16 and 17 illustrate cross-sectional views 1600, 1700 of some embodiments corresponding to Act 416.

As illustrated by FIG. 16, a protective layer 1602 is formed over the memory cell region 106 and the capacitor region 108. The protective layer 1602 may be formed as, for example, an oxide, such as silicon dioxide. The process for forming the protective layer 1602 may include forming an intermediate layer over the semiconductor substrate 110 and patterning the intermediate layer.

Also illustrated by FIG. 16, a logic device stack 1604 is formed over the logic region 114. The logic device stack 1604 may include, for example, a logic gate 154, fifth and sixth dielectric layers 152, 158, a logic hard mask 156, and a first spacer layer 150. The fifth dielectric layer 152 may be arranged between the semiconductor substrate 110 and the logic gate 154, and the logic hard mask 156 may be arranged over the logic gate 154 with the sixth dielectric layer 158 arranged therebetween. The fifth and sixth dielectric layers 152, 158 may be, for example, an oxide. The logic hard mask 156 may, for example, be a nitride. The logic gate 154 may be, for example, doped polysilicon. The first spacer layer 150 may be arranged along sidewalls of the logic gate 154, the fifth and sixth dielectric layers 152, 158, and the logic hard mask 156. The first spacer layer 150 may be, for example, an oxide or a nitride.

As illustrated by FIG. 17, an eighth etch is performed to remove the protective layer 1602. The eighth etch may be performed by applying an etchant selective of the protective layer 1602 to the protective layer 1602. Further, dopants are implanted into exposed regions of the logic region 114 and the memory cell region 106 to define first doped regions 1702, 1703. Thereafter, second and third spacer layers 164, 166 are formed. The second spacer layer 164 is formed along sidewalls of the select and control gates 120, 126 and the finger trench capacitor 104. The third spacer layer 166 is formed along sidewalls of the first and second spacer layers 150, 164.

With the second and third spacer layers 164, 166 formed, dopants are implanted into exposed regions of the memory cell region 106 and the logic region 114 to define second doped regions 1705, 1706. The second doped regions 1705, 1706 typically have a higher concentration of dopants than the first doped regions 1702, 1703. In some embodiments, after forming the first and second doped regions 1702, 1703, 1705, 1706, silicide layers 130, 132, 162 are formed over the doped regions 1702, 1703, 1705, 1706 and/or the control gate 126. The process may include, for example, forming an RPO layer 174 on regions upon which silicide is undesired, and growing the silicide.

Figure 18:
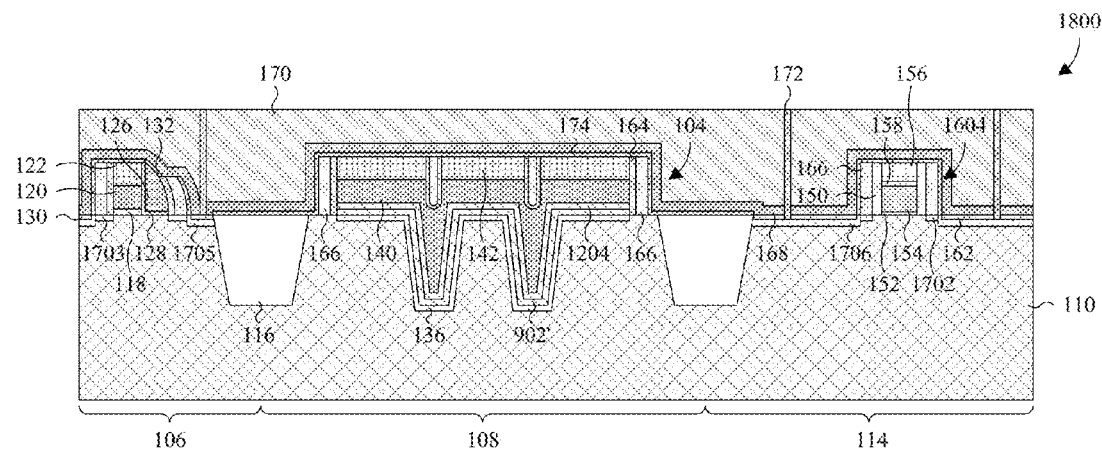

FIG. 18 illustrates cross-sectional view 1800 of some embodiments corresponding to Act 418. As illustrated, a BEOL metallization stack is formed over the semiconductor structure. This includes forming a contact etch stop layer 168 lining the semiconductor structure. Thereafter, an ILD layer 170 is formed over the contact etch stop layer 168 and planarized. Further, contacts 172 are formed extending through the ILD layer 170 and the contact etch stop layer 168, typically to the silicide layers 130, 132, 162.

Figure 19:
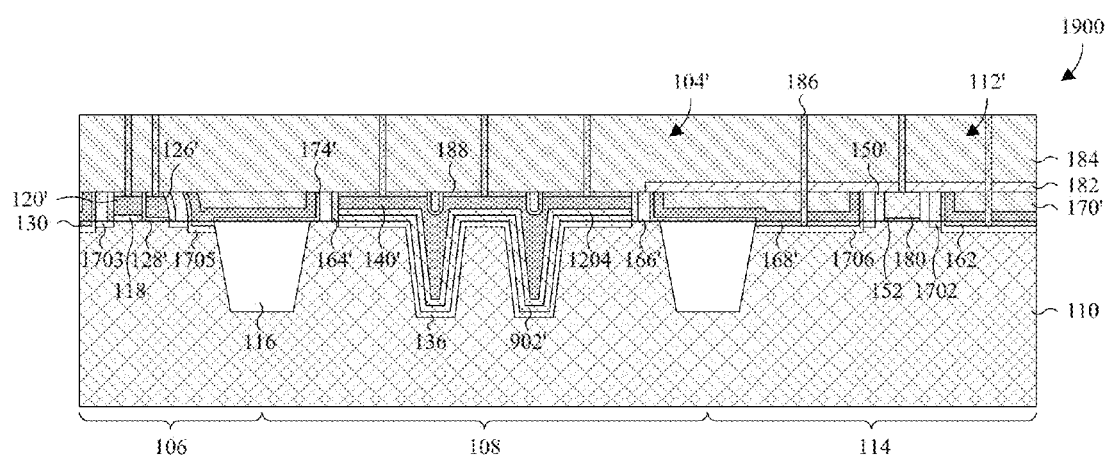

The cross-sectional view 1800 of FIG. 18 illustrates a process commonly used to form a logic device with a polysilicon gate. However, the logic device may be formed with a metal gate. FIG. 19 illustrates a cross-sectional view 1900 of some embodiments corresponding to Acts 416 and 418 for a process commonly used to form a logic device with a metal gate.

As illustrated by FIG. 19, after forming the ILD layer 170, a planarization is performed to remove the select gate hard mask 122, the capacitor hard mask 142, and the logic hard mask 156. Typically, the planarization extends into one or more of: the ILD layer 170; the contact etch stop layer 168; the first, second, and third spacer layers 150, 164, 166; the RPO layer 174; the control gate 126; the control gate dielectric layer 128; and the control gate silicide layer 132. The planarization may be performed by, for example, a chemical mechanical polish (CMP) and/or an etch back.

After the planarization, the logic gate 154 is replaced with a metal gate 180, and a dielectric capping layer 182 masking the logic region 114 is formed. For example, an intermediate dielectric capping layer is formed over and/or within the semiconductor structure and selectively etched to limit it to the logic region 114. Further, additional silicide layers 188 are grown over one or more of the select gate 120, the control gate 126, and the upper electrode 140 with a self-aligned process.

With the additional silicide layers 188 formed, a second ILD layer 184 is formed over the dielectric capping layer 182, the remaining ILD layer 170', contact etch stop layer 168', first, second, and third sidewall spacer layers 150', 164', 166', RPO layer 174', control gate 126', control gate charge trapping dielectric layer 128', and select gate 120'. Typically, the second ILD layer 184 is formed with a planar top surface. With the second ILD layer 184 formed, contacts 186 are formed extending through the remaining ILD layer 170' and the remaining contact etch stop layer 168'.

Figure 20:
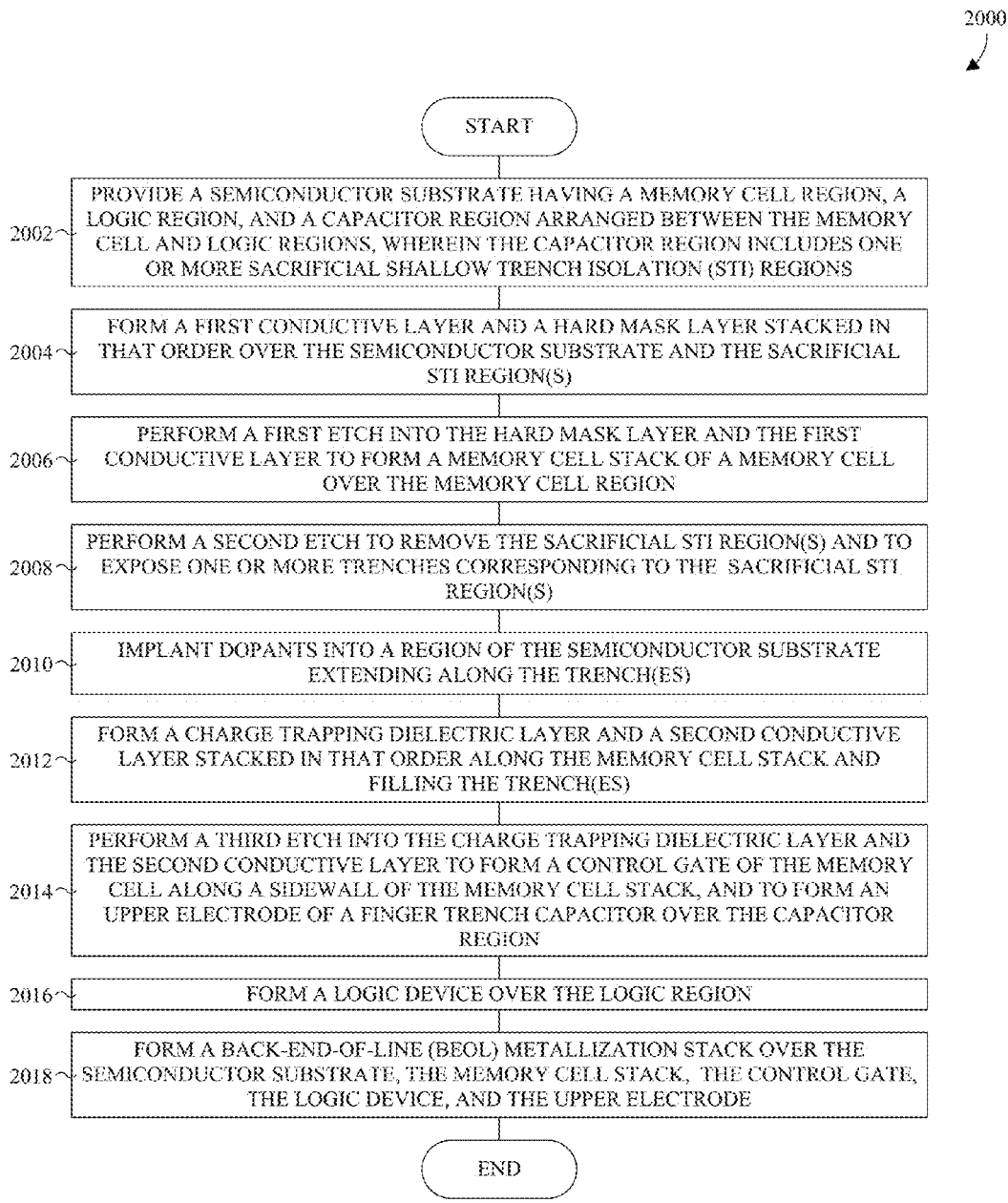
FIG. 20 illustrates a flowchart of other more detailed embodiments of the method of FIG. 3.

With reference to FIG. 20, a flowchart of other more detailed embodiments of the method of FIG. 3 is provided. As will be seen, these embodiments form an upper electrode of a finger trench capacitor and a control gate of a split-gate flash memory cell.

At 2002, a semiconductor substrate having a memory cell region, a logic region, and a capacitor region arranged between the memory cell and logic regions is provided. The capacitor region includes one or more sacrificial STI regions.

At 2004, a first conductive layer and a hard mask layer are formed stacked in that order over the semiconductor substrate and the sacrificial STI region(s).

At 2006, a first etch is performed into the hard mask layer and the first conductive layer to form a memory cell stack of a memory cell over the memory cell region.

At 2008, a second etch is performed to remove the sacrificial STI region(s) and to expose one or more trenches corresponding to the sacrificial STI region(s).

At 2010, dopants are implanted into a region of the semiconductor substrate extending along the trench(es).

At 2012, a charge trapping dielectric layer and a second conductive layer are formed stacked in that order along the memory cell stack and filling the trench(es).

At 2014, a third etch is performed into the charge trapping dielectric layer and the second conductive layer to form a control gate of the memory cell along a sidewall of the memory cell stack, and to form an upper electrode of a finger trench capacitor over the capacitor region.

At 2016, a logic device is formed over the logic region.

At 2018, a BEOL metallization stack is formed over the semiconductor substrate, the memory cell stack, the control gate, the logic device, and the upper electrode.

While the method described by the flowchart 2000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 21-34, cross-sectional views of some embodiments of a semiconductor structure at various stages of manufacture are provided to illustrate the method of FIG. 20. Although FIGS. 21-34 are described in relation to the method, it will be appreciated that the structures disclosed in FIGS. 21-34 are not limited to the method, but instead may stand alone as structures independent of the method. Similarly, although the method is described in relation to FIGS. 21-34, it will be appreciated that the method is not limited to the structures disclosed in FIGS. 21-34, but instead may stand alone independent of the structures disclosed in FIGS. 21-34.

Figure 21:
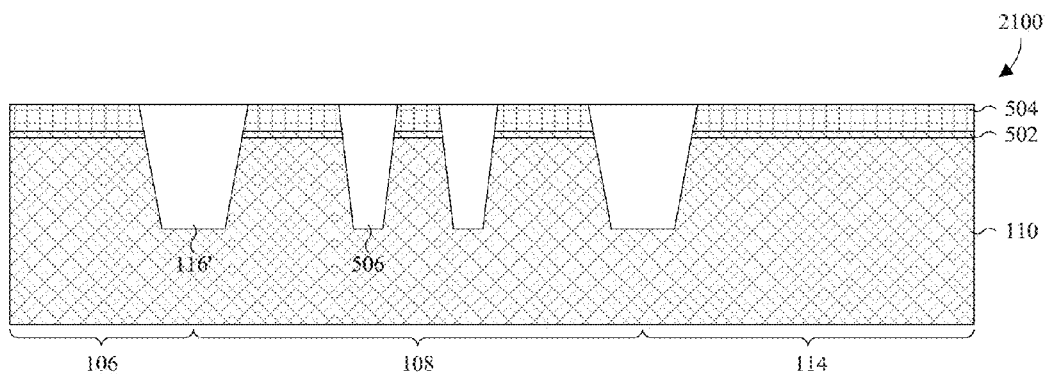
FIGS. 21-34 illustrate a series of cross-sectional views of some embodiments of an integrated circuit at various stages of manufacture, the integrated circuit including a split-gate flash memory cell and a finger trench capacitor.

FIG. 21 illustrates a cross-sectional view 2100 of some embodiments corresponding to Act 2002. As illustrated, a semiconductor substrate 110 is provided. The semiconductor substrate 110 includes a memory cell region 106, a logic region 114, and a capacitor region 108 arranged between the memory cell region 106 and the logic region 114. Further, the semiconductor substrate 110 is covered by a first dielectric layer 502 and a first hard mask layer 504 stacked in that order. The first dielectric layer 502 may be, for example, an oxide. The first hard mask layer 504 may be, for example, a nitride. The semiconductor substrate 110 may be, for example, a bulk silicon substrate or an SOI substrate.

First STI regions 116' extend through the first dielectric layer 502 and the hard mask layer 504 into the semiconductor substrate 110 to isolate the memory cell region 106, the capacitor region 108, and the logic region 114 from each other. One or more second, sacrificial STI regions 506 extend through the first dielectric layer 502 and the first hard mask layer 504 into the capacitor region 108.

Figure 22:
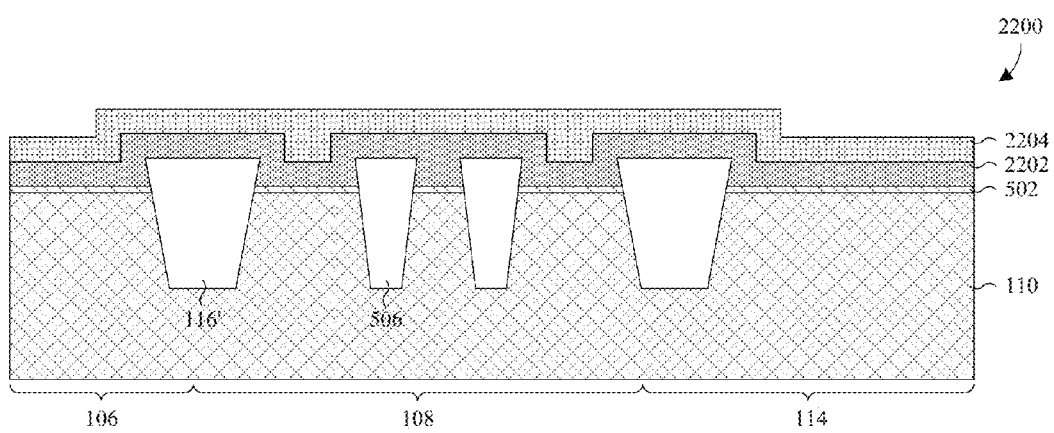

FIG. 22 illustrates a cross-sectional view 2200 of some embodiments corresponding to Act 2004. As illustrated by FIG. 22, a first etch is performed into the first hard mask layer 504 to remove the first hard mask layer 504. The process for performing the first etch may include, for example, applying an etchant selective of the first hard mask layer 504 relative to the first dielectric layer 502.

Also illustrated by FIG. 22, a first conductive layer 2202 and a second hard mask layer 2204 are formed stacked in that order over the semiconductor substrate 110. The first conductive layer 2202 and the second hard mask layer are formed lining the first dielectric layer 502 and exposed regions of the first and second STI regions 116', 506. The first conductive layer 2202 may be, for example, a conductive material, such as doped polysilicon or metal. The second hard mask layer 2204 may be, for example, a nitride, such as silicon nitride.

Figure 23:
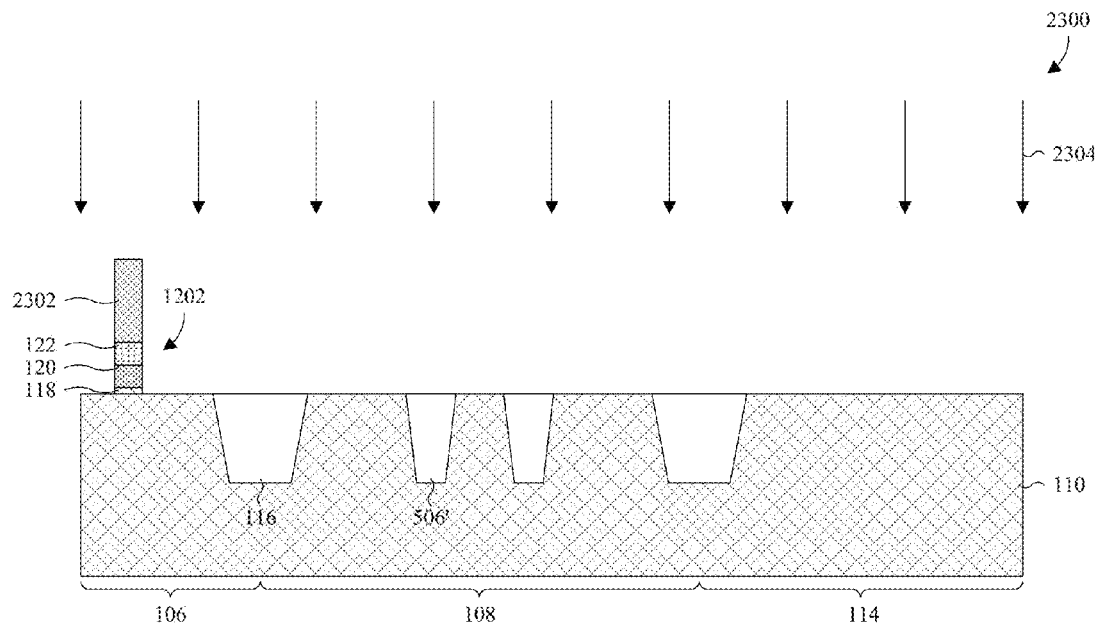

FIG. 23 illustrates a cross-sectional view 2300 of some embodiments corresponding to Act 2006. As illustrated by FIG. 23, one or more second etches are performed to the semiconductor substrate 110 through select regions of the second hard mask layer 2204, the first conductive layer 2202, and the first dielectric layer 502. The second etch(es) result in a memory cell stack 1202 over the memory cell region 106. The memory cell stack 1202 includes a select gate hard mask 122 overlying a select gate 120, and a select gate dielectric layer 118 underlying the select gate 120 between the select gate 120 and the semiconductor substrate 110. In some embodiments, the second etch(es) etch back the first and second STI regions 116', 506 to about even with a top surface of the semiconductor substrate 110.

The process for performing the second etch(es) may include, for example, forming a photoresist layer 2302 masking regions of the second hard mask layer 2204 corresponding to the memory cell stack 1202. One or more etchants 2304 may then be applied to the second hard mask layer 2204, the first conductive layer 2202, and the first dielectric layer 502. Following application of the etchant(s) 2304, the photoresist layer 2302 may be removed.

Figure 24:
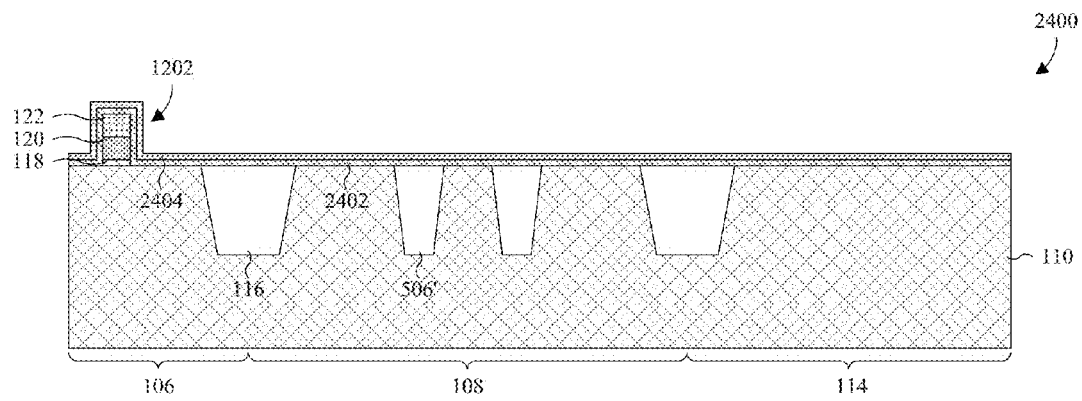
Figure 25:
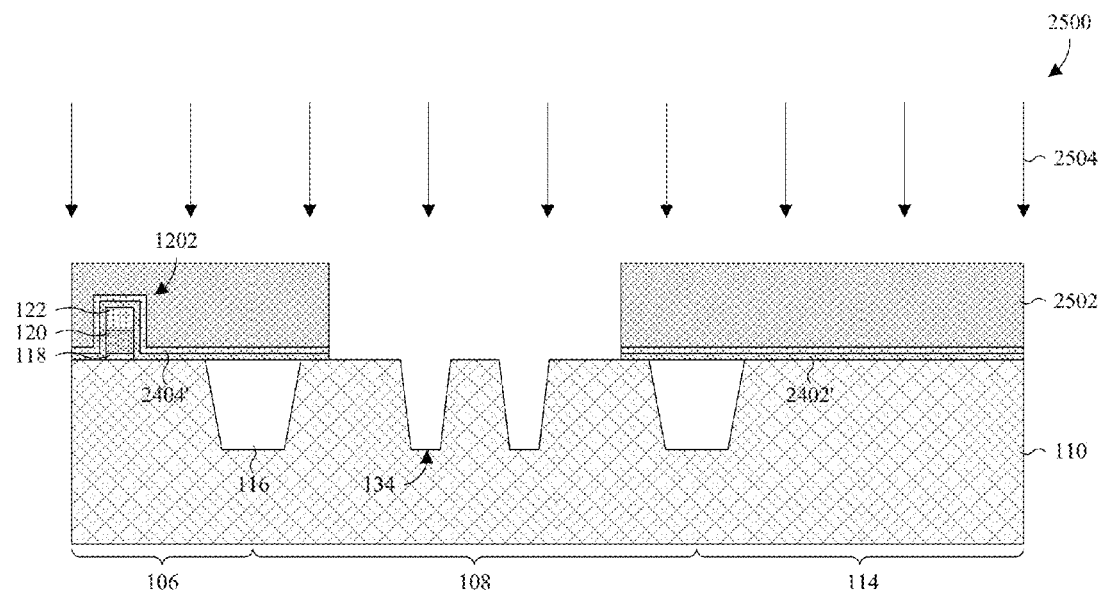

FIGS. 24 and 25 illustrate cross-sectional views 2400, 2500 of some embodiments corresponding to Act 2008.

As illustrated by FIG. 24, a second dielectric layer 2402 and a third hard mask layer 2404 are formed stacked over the semiconductor substrate 110, and the remaining first and second STI regions 116, 506'. Further, the second dielectric layer 2402 and the third hard mask layer 2404 are formed lining the memory cell stack 1202. The second dielectric layer 2402 may be formed as, for example, an oxide, such as silicon dioxide. The third hard mask layer 2404 may be formed as, for example, a nitride, such as silicon nitride.

As illustrated by FIG. 25, one or more third etches are performed through regions of the third hard mask layer 2404 and the second dielectric layer 2402 overlying the capacitor region 108 to remove these regions. Further, the third etch(es) remove the remaining sacrificial STI region(s) 506'. By removing the remaining sacrificial STI region(s) 506', one or more trenches 134 corresponding to the remaining sacrificial STI region(s) 506' are exposed. The process for performing the third etch(es) may include, for example, forming a photoresist layer 2502 masking regions of the third hard mask layer 2404 surrounding the capacitor region 108. One or more etchants 2504 may then be sequentially applied to the third hard mask layer 2404, the second dielectric layer 2402, and the remaining sacrificial STI region(s) 506'. With the etchant(s) 2504 applied, the photoresist layer 2502 may be removed.

Figure 26:
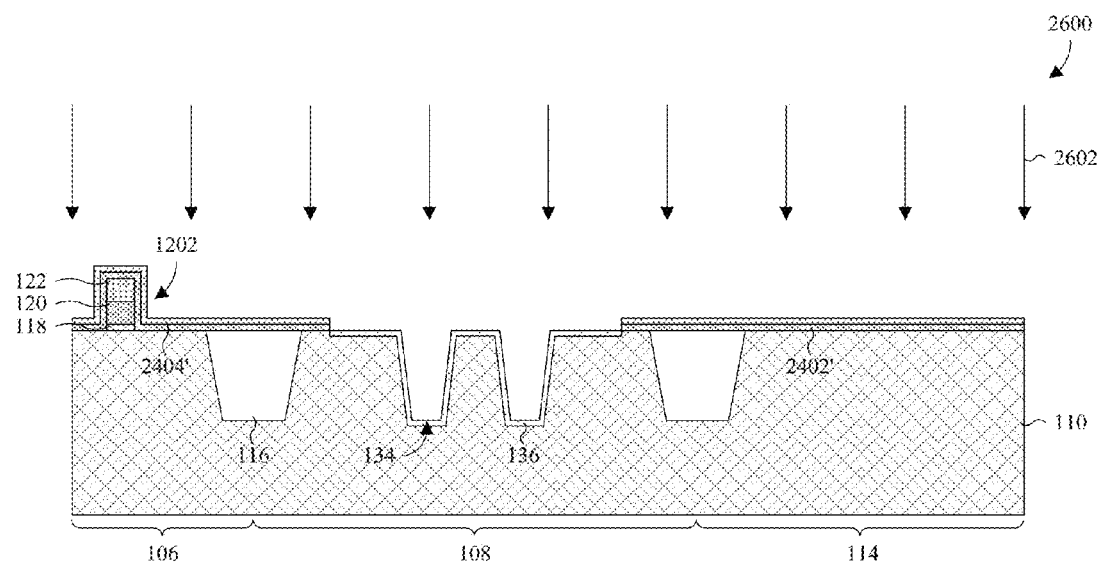

FIG. 26 illustrates a cross-sectional view 2600 of some embodiments corresponding to Act 2010. As illustrated, dopants 2602 are implanted into an exposed region of the semiconductor substrate 110 lining the trench(es) 134. The doped region 136 of the semiconductor substrate 110 defines a lower electrode of a finger trench capacitor being formed.

Figure 27:
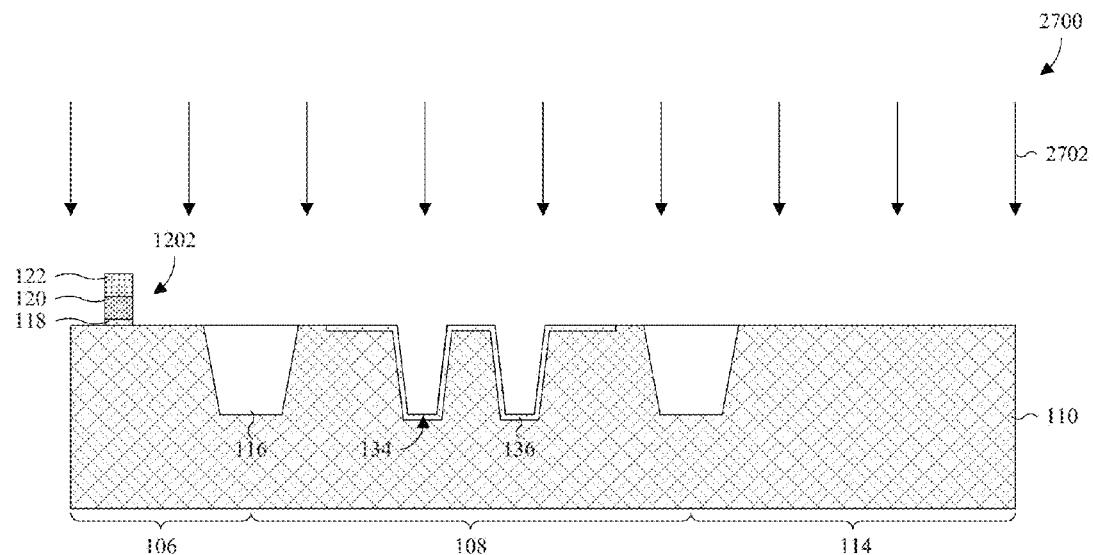
Figure 28:
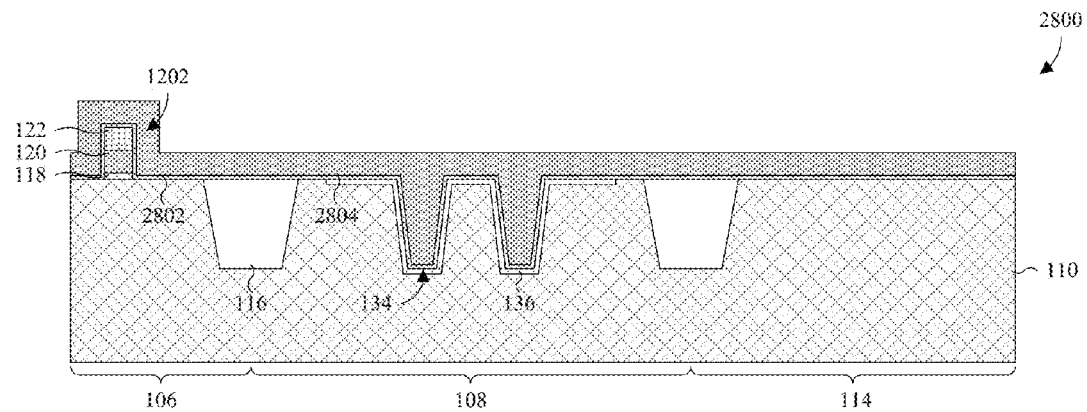

FIGS. 27 and 28 illustrate cross-sectional views 2700, 2800 of some embodiments corresponding to Act 2012.

As illustrated by FIG. 27, one or more fourth etches are performed into the remaining third hard mask layer 2404' and the remaining second dielectric layer 2402' to remove these layers. The process for performing the fourth etch(es) may include, for example, applying one or more etchants 2702 selective of the remaining third hard mask layer 2404' and the remaining second dielectric layer 2402'.

As illustrated by FIG. 28, a third, charge trapping dielectric layer 2802 and a second conductive layer 2804 are formed stacked in that order over the semiconductor substrate 110. The charge trapping dielectric layer 2802 and the second conductive layer 2804 are formed lining the memory cell stack 1202 and filling the trench(es) 134. The charge trapping dielectric layer 2802 lines the trench(es) 134, and the second conductive layer 2804 filles the trench(es) 134 over the charge trapping dielectric layer 2802. The charge trapping dielectric layer 2802 may be formed as, for example, a multilayer ONO stack or a multilayer OSiO stack. The second conductive layer 2804 may be formed as, for example, doped polysilicon or a metal.

Figure 29:
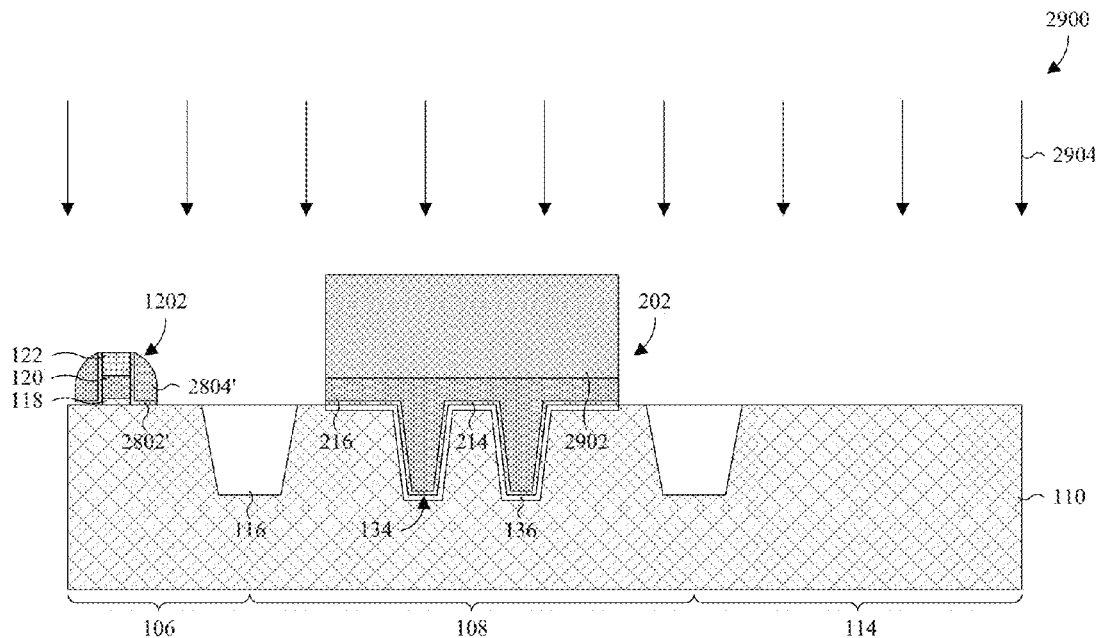
Figure 30:
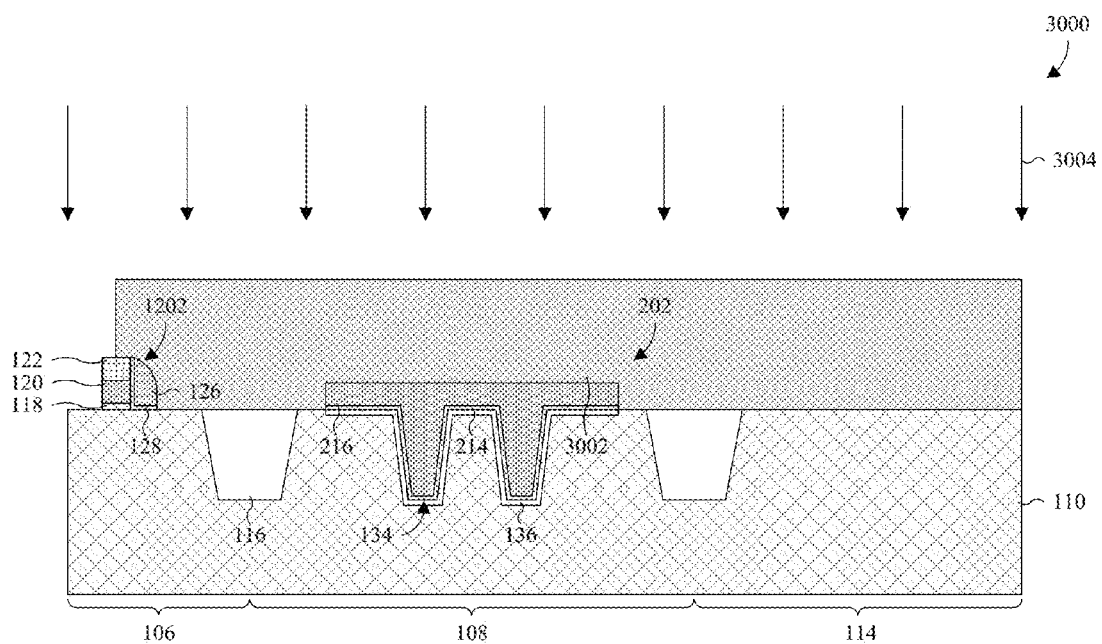

FIGS. 29 and 30 illustrate cross-sectional views 2900, 3000 of some embodiments corresponding to Act 2014.

As illustrated by FIG. 29, one or more fifth etches are performed into the second conductive layer 2804 and the charge trapping dielectric layer 2802 to form a finger trench capacitor 202, and to remove lateral stretches of the second conductive layer 2804 and the charge trapping dielectric layer 2802 surrounding the finger trench capacitor 202. The process for performing the fifth etch(es) may include, for example, forming a photoresist layer 2902 masking the capacitor region 108. Thereafter, an etchant selective of the second conductive layer 2804 may be applied to etch back the second conductive layer 2804 and remove lateral stretches surrounding the capacitor region 108. Further, one or more additional etchants 2904 selective of the charge trapping dielectric layer 2802 may be applied to etch back the charge trapping dielectric layer 2802 and remove lateral stretches unmasked by the remaining second conductive layer 2804' and the photoresist layer 2902. With the additional etchants 2904 applied, the photoresist layer 2902 may be removed.

As illustrated by FIG. 30, one or more sixth etches are performed into the remaining second conductive layer 2804' and the remaining charge trapping dielectric layer 2802'. The sixth etch(es) remove regions of the remaining second conductive layer 2804' and the remaining charge trapping dielectric layer 2802' on all but a side of the memory cell stack 1202 neighboring the finger trench capacitor 202. The sixth etch(es) form a control gate 126 along a single sidewall of the memory cell stack 1202. The process for performing the sixth etch(es) may include, for example, forming a photoresist layer 3002 masking regions of the remaining second conductive layer 2804' corresponding to the control gate 126 and to the finger trench capacitor 202. One or more etchants 3004 may then be applied to the remaining second conductive layer 2804' and the remaining charge trapping dielectric layer 2802' according to the pattern of the photoresist layer 3002. Further, the photoresist layer 3002 may be removed.

Figure 31:
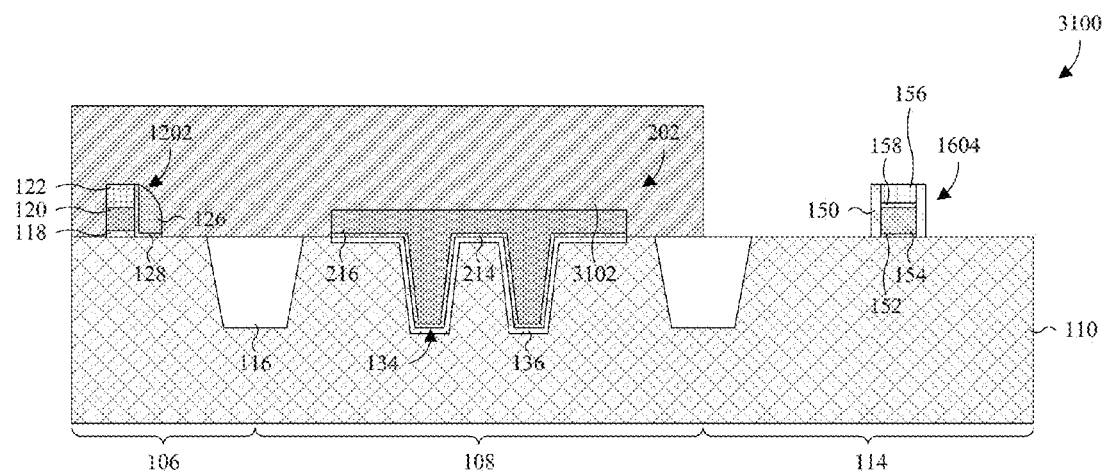
Figure 32:
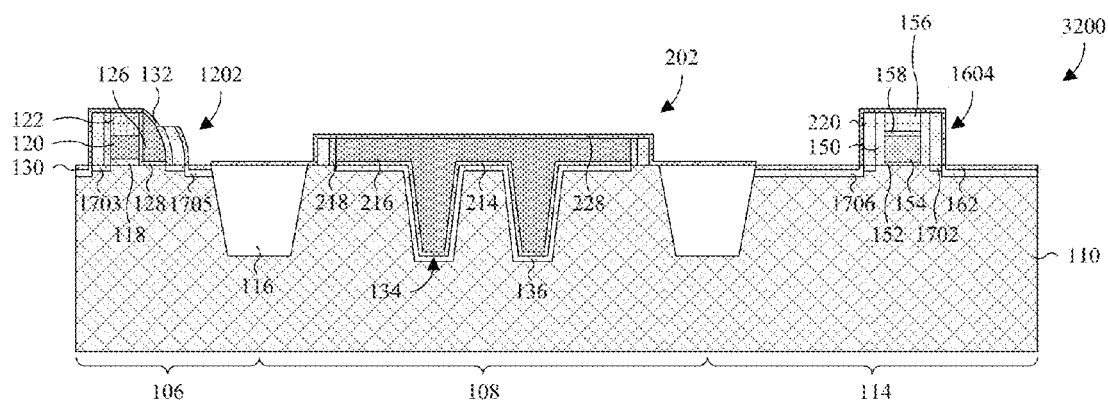

FIGS. 31 and 32 illustrate cross-sectional views 3100, 3200 of some embodiments corresponding to Act 2016.

As illustrated by FIG. 31, a protective layer 3102 is formed over the memory cell region 106 and the capacitor region 108. The protective layer 3102 may be formed as, for example, an oxide, such as silicon dioxide. The process for forming the protective layer 3102 may include forming an intermediate layer over the semiconductor substrate 110 and patterning the intermediate layer, Also illustrated by FIG. 31, a logic device stack 1604 is formed over the logic region 114. The logic device stack 1604 may include, for example, a logic gate 154, fourth and fifth dielectric layers 152, 158, a logic hard mask 156, and a first spacer layer 150. The fourth dielectric layer 152 may be arranged between the semiconductor substrate 110 and the logic gate 154, and the logic hard mask 156 may be arranged over the logic gate 154 with the fifth dielectric layer 158 arranged therebetween. The fourth and fifth dielectric layers 152, 158 may be, for example, an oxide. The logic hard mask 156 may, for example, be a nitride. The logic gate 154 may be, for example, doped polysilicon. The first spacer layer 150 may be arranged along sidewalls of the logic gate 154, the fourth and fifth dielectric layers 152, 158, and the logic hard mask 156. The first spacer layer 150 may be, for example, an oxide or a nitride.

As illustrated by FIG. 32, a seventh etch is performed to remove the protective layer 3102. The seventh etch may be performed by applying an etchant selective of the protective layer 3102 to the protective layer 3102. Further, dopants are implanted into exposed regions of the logic region 114 and the memory cell region 106 to define first doped regions 1702, 1703. Thereafter, second and third spacer layers 218, 220 are formed. The second spacer layer 218 is formed along sidewalls of the select and control gates 120, 126 and the finger trench capacitor 202. The third spacer layer 220 is formed along sidewalls of the first and second spacer layers 150, 218.

With the second and third sidewall layers 218, 220 formed, dopants are implanted into exposed regions of the memory cell region 106 and the logic region 114 to define second doped regions 1705, 1706. The second doped regions 1705, 1706 typically have a higher concentration of dopants than the first doped regions 1702, 1703. In some embodiments, after forming the first and second doped regions, 1702, 1703, 1705, 1706, silicide layers 130, 132, 162 are formed over the doped regions 1702, 1703, 1705, 1706 and/or the control gate 126. The process may include, for example, forming an RPO layer 228 on regions upon which silicide is undesired, and growing the silicide.

Figure 33:
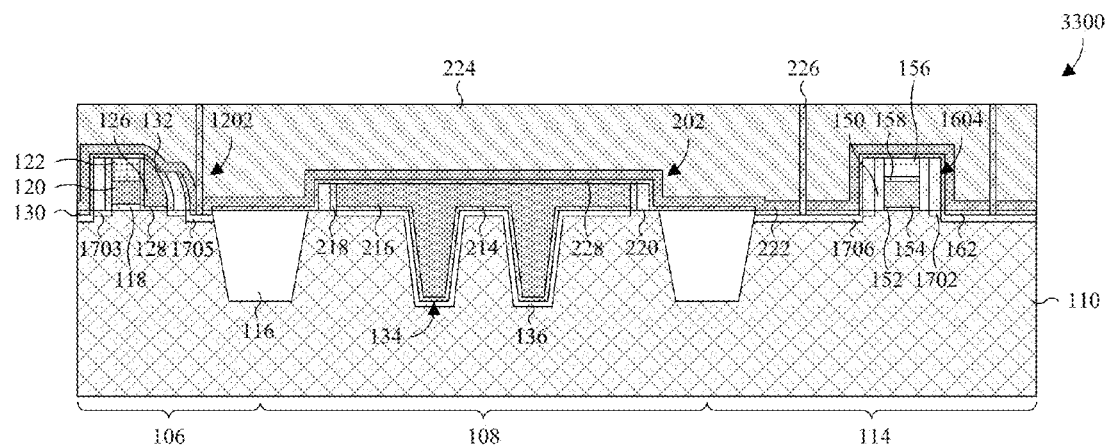

FIG. 33 illustrates cross-sectional view 3300 of some embodiments corresponding to Act 2018. As illustrated, a BEOL metallization stack is formed over the semiconductor structure. This includes forming a contact etch stop layer 222 lining the semiconductor structure. Thereafter, an ILD layer 224 is formed over the contact etch stop layer 222 and planarized. Further, contacts 226 are formed extending through the ILD layer 224 and the contact etch stop layer 222, typically to the silicide layers 130, 132, 162.

Figure 34:
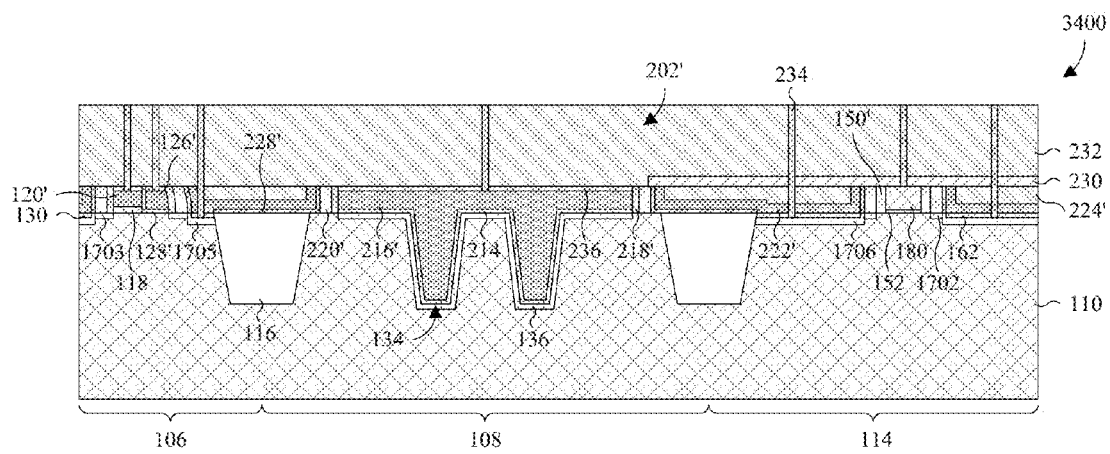

The cross-sectional view 3300 of FIG. 33 illustrates a process commonly used to form a logic device with a polysilicon gate. However, the logic device may be formed with a metal gate. FIG. 34 illustrates a cross-sectional view 3400 of some embodiments corresponding to Acts 2016 and 2018 for a process commonly used to form a logic device with a metal gate.

As illustrated by FIG. 34, after forming the ILD layer 224, a planarization is performed to remove the select gate hard mask 122 and the logic hard mask 156. Typically, the planarization extends into one or more of: the ILD layer 224; the contact etch stop layer 222; the first, second, and third spacer layers 150, 218, 220; the RPO layer 228; the control gate 126; the control gate dielectric layer 128; and the control gate silicide layer 132. The planarization may be performed by, for example, a CMP.

After the planarization, the logic gate 154 is replaced with a metal gate 180, and a dielectric capping layer 230 masking the logic region 114 is formed. For example, an intermediate dielectric capping layer is formed over the semiconductor structure and selectively etched to limit it to the logic region 114. Further, additional silicide layers 236 are grown over the select gate 120, the control gate 126, and the upper electrode 216 with a self-aligned process.

With the additional silicide layers 236 formed, a second ILD layer 232 is formed over the remaining ILD layer 224', contact etch stop layer 222', first, second, and third spacer layers 150', 218', 220', RPO layer 228', control gate 126', control gate charge trapping dielectric layer 128', and select gate 120'. Typically, the second ILD layer 232 is formed with a planar top surface. With the second ILD layer 232 formed, contacts 234 are formed extending through the remaining first ILD layer 224' and the remaining contact etch stop layer 222'.

Thus, as can be appreciated from above, the present disclosure provides a method for manufacturing an integrated circuit. A semiconductor substrate having a memory cell region and a capacitor region is provided. The capacitor region includes one or more sacrificial STI regions. A first etch is performed into the one or more sacrificial STI regions to remove the one or more sacrificial STI regions and to expose one or more trenches corresponding to the one or more sacrificial STI regions. Dopants are implanted into regions of the semiconductor substrate lining the one or more trenches. A conductive layer is formed over the semiconductor substrate and filling the one or more trenches. A second etch is performed into the conductive layer to form one of a control gate and a select gate of a memory cell over the memory cell region, and to form an upper electrode of a finger trench capacitor over the capacitor region.

In other embodiments, the present disclosure provides an integrated circuit. A semiconductor substrate has a memory cell region and a capacitor region. The capacitor region includes one or more trenches. A memory cell is arranged over the memory cell region. The memory cell includes a polysilicon select gate, a polysilicon control gate alongside the polysilicon select gate, and a charge trapping dielectric layer. The charge trapping dielectric layer is arranged under the control gate and between neighboring sidewalls of the select and control gates. A finger trench capacitor is arranged over the capacitor region in the one or more trenches. The finger trench capacitor includes a lower electrode corresponding to a doped region in the semiconductor substrate and an upper electrode made of polysilicon and separated from the lower electrode by a capacitor dielectric layer lining the one or more trenches.

In yet other embodiments, the present disclosure provides an embedded flash device. A semiconductor substrate has a memory cell region, a logic region, and a capacitor region arranged between the memory cell region and the logic region. The capacitor region includes one or more trenches. A memory cell is arranged over the memory cell region. The memory cell includes a select gate, a control gate, and a charge trapping dielectric layer. The charge trapping dielectric layer is arranged under the control gate and between neighboring sidewalls of the select and control gates. A finger trench capacitor is arranged over the capacitor region in the one or more trenches. The finger trench capacitor includes an upper electrode spaced from the semiconductor substrate. A conductive layer includes the upper electrode, and one of the select gate and the control gate. A logic device is arranged over the logic region. The logic device includes a gate spaced from the semiconductor substrate by an intermediate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit, the method comprising:
   providing a semiconductor substrate having a memory cell region and a capacitor region, wherein the capacitor region includes one or more sacrificial shallow trench isolation (STI) regions;
   performing a first etch into the one or more sacrificial STI regions to remove the one or more sacrificial STI regions and to expose one or more trenches corresponding to the one or more sacrificial STI regions;
   implanting dopants into regions of the semiconductor substrate lining the one or more trenches;

after implanting the dopants, forming a dielectric layer, a conductive layer, and a hard mask layer stacked in that order over the semiconductor substrate and filling the one or more trenches; and performing a second etch into the hard mask layer, the conductive layer, and the dielectric layer to form a memory cell stack of a memory cell over the memory cell region, and to form an upper electrode of a finger trench capacitor over the capacitor region, wherein the memory cell stack includes a select gate.

2. The method according to claim 1, further including:
forming a charge trapping dielectric layer and a second conductive layer stacked in that order, and lining the memory cell stack and the finger trench capacitor;
performing a third etch into the second conductive layer to form a control gate of the memory cell along a sidewall of the memory cell stack; and
performing a fourth etch into the charge trapping dielectric layer to remove lateral stretches unmasked by the control gate.

3. The method according to claim 1, further including:
forming a finger of the upper electrode with a ratio of height to width exceeding about three.

4. The method according to claim 1, wherein the semiconductor substrate includes a logic region, and wherein the method further includes:
forming a logic device over the logic region.

5. The method according to claim 4, further including:
forming a metal gate of the logic device overlying a dielectric layer with a dielectric constant exceeding about 3.9.

6. The method according to claim 4, further including:
performing a planarization into the logic device, the select gate, and the upper electrode so corresponding upper surfaces are approximately coplanar.

7. The method according to claim 1, further including:
forming the memory cell as a split-gate flash memory cell.

8. The method according to claim 1, wherein the one or more trenches comprise a first trench, and wherein the implanting forms a doped semiconductor region extending along opposing sidewalls of the first trench from a top surface of the semiconductor substrate to a bottom surface of the first trench, and further extending along the bottom surface of the first trench respectively from and to the opposing sidewalls.

9. The method according to claim 2, wherein the upper electrode comprises one or more top recesses directly over the one or more trenches, and wherein the second conductive layer is formed filling the top recesses of the upper electrode.

10. A method for manufacturing an integrated circuit, the method comprising:
forming first shallow trench isolation (STI) regions and second STI regions in a semiconductor substrate, wherein the first STI regions are formed dividing the semiconductor substrate into a memory cell region, a logic region, and a capacitor region, and wherein the second STI regions are formed localized to the capacitor region;
performing a first etch into the semiconductor substrate to remove the second STI regions, without removing the first STI regions, and to expose trenches in the capacitor region that correspond to the second STI regions;
implanting dopants into the capacitor region to form a doped region along surfaces of the capacitor region and the trenches, wherein the doped region defines a lower electrode of a finger trench capacitor;
forming a conductive layer over and lining the semiconductor substrate and the trenches;
performing a second etch into the conductive layer to form a memory cell gate electrode localized to the memory cell region and to form an upper electrode of the finger trench capacitor localized to the capacitor region; and
after the second etch, forming a logic device localized to the logic region.

11. The method according to claim 10, wherein the second STI regions are formed extending laterally in parallel and laterally spaced.

12. The method according to claim 10, further comprising:
forming a dielectric layer over and lining the semiconductor substrate and the trenches;
forming the conductive layer over and lining the dielectric layer;
forming a hard mask layer over and lining the conductive layer; and
performing the second etch through the hard mask layer, the conductive layer, and the dielectric layer to form a memory cell stack and a capacitor stack respectively including the memory cell gate electrode and the upper electrode of the finger trench capacitor.

13. The method according to claim 10, further comprising:
forming a charge trapping layer covering, and lining sidewalls of, the memory cell gate electrode and the upper electrode;
forming another conductive layer over and lining the charge trapping layer; and
performing a third etch into the other conductive layer and the charge trapping layer to remove lateral stretches of the charge trapping and other conductive layers, and to form an additional memory cell gate electrode spaced from the memory cell gate electrode by the charge trapping layer.

14. The method according to claim 10, wherein forming the logic device comprises forming the logic device with a dummy gate electrode, and wherein the method further comprises:
performing a planarization to coplanarize upper surfaces respectively of the dummy gate electrode, the upper electrode, and the memory cell gate electrode;
replacing the dummy gate electrode with a metal gate electrode;
forming a first dielectric layer covering the logic region, but not the memory cell region and the capacitor region; and
forming a second dielectric layer covering the first dielectric layer, the memory cell region, and the capacitor region, wherein the first and second dielectric layers are different materials.

15. A method for manufacturing an integrated circuit, the method comprising:
forming shallow trench isolation (STI) regions in a semiconductor substrate, wherein the STI regions are formed over a capacitor region of the semiconductor substrate;
forming a first gate electrode of a memory cell over a memory cell region of the semiconductor substrate that is spaced from the capacitor region;
after forming the first gate electrode, performing a first etch into the semiconductor substrate to remove the STI regions and to expose trenches in the capacitor region that correspond to the STI regions;

implanting dopants into the capacitor region to form a doped region along surfaces of the capacitor region and the trenches, wherein the doped region defines a lower electrode of a finger trench capacitor;

forming a conductive layer extending along sidewalls of the first gate electrode and lining the trenches; and performing a second etch into the conductive layer to form a second gate electrode of the memory cell over the memory cell region and to form an upper electrode of the finger trench capacitor over the capacitor region.

16. The method according to claim 15, wherein the dopants are implanted into the capacitor region, but not the memory cell region.

17. The method according to claim 15, further comprising:

forming an additional conductive layer over and lining the semiconductor substrate and the STI regions;

forming a hard mask layer over and lining the other conductive layer; and performing a third etch through the hard mask layer and the other conductive layer to form a memory cell stack including the first gate electrode, wherein the third etch removes the hard mask layer and the other conductive layer from the capacitor region.

18. The method according to claim 15, further comprising:

forming a charge trapping layer covering, and lining sidewalls of, the first gate electrode, and further lining the trenches;

forming the conductive layer over and lining the charge trapping layer; and performing the second etch into the conductive layer and the charge trapping layer to remove lateral stretches of the conductive and charge trapping layers and to form the second gate electrode spaced from the first gate electrode by the charge trapping layer.

19. The method according to claim 15, further comprising:

after the second etch, forming a third gate electrode over a logic region of the semiconductor substrate that is spaced from the memory cell and capacitor regions; and performing a planarization to coplanarize top surfaces respectively of the first, second, and third gate electrodes with a top surface of the upper electrode.

20. The method according to claim 15, wherein performing the second etch comprises forming the second gate electrode with a sidewall and a bottom surface respectively contacting a sidewall of a charge trapping layer and an upper surface of the charge trapping layer.

* * * * *